US012644910B2

(12) United States Patent
Campbell et al.

(10) Patent No.: US 12,644,910 B2
(45) Date of Patent: Jun. 2, 2026

(54) CURRENT MONITOR COMBINING A SHUNT RESISTOR WITH A ROGOWSKI COIL

(71) Applicant: Tektronix, Inc., Beaverton, OR (US)

(72) Inventors: Julie A. Campbell, Beaverton, OR (US); Emily L. Becher, Beaverton, OR (US); David M. Ediger, Portland, OR (US); Matthew J. Hull, Beaverton, OR (US); Daniel G. Knierim, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 261 days.

(21) Appl. No.: 18/499,143

(22) Filed: Oct. 31, 2023

(65) Prior Publication Data

US 2024/0061021 A1 Feb. 22, 2024

Related U.S. Application Data

(63) Continuation-in-part of application No. 18/225,034, filed on Jul. 21, 2023, now Pat. No. 12,442,838, and
(Continued)

(51) Int. Cl.
*G01R 15/18* (2006.01)
*G01R 15/14* (2006.01)
*G01R 19/00* (2006.01)

(52) U.S. Cl.
CPC ......... *G01R 15/181* (2013.01); *G01R 15/146* (2013.01); *G01R 19/0092* (2013.01)

(58) Field of Classification Search
CPC . G01R 15/181; G01R 15/146; G01R 19/0092
(Continued)

(56) References Cited

U.S. PATENT DOCUMENTS 5,325,728 A * 7/1994 Zimmerman ........... G01F 15/18
                                                          73/861.11
6,670,799 B1 12/2003 Bull et al.
(Continued)

FOREIGN PATENT DOCUMENTS

CN        102368085 A * 3/2012 ............. H01F 38/34
EP          678956 A1 * 10/1995 ............. G01R 15/04
(Continued)

*Primary Examiner* — Arleen M Vazquez
*Assistant Examiner* — Robert P Alejnikov, Jr.
(74) *Attorney, Agent, or Firm* — Andrew J. Harrington

(57) ABSTRACT

A current measurement device with a shunt resistor of a resistive core with an opening and measurement leads, a Rogowski coil with electrical contacts surrounding the resistive core, conductive layers on first and second sides of the resistive core, one or more insulative layers between the conductive layers and the Rogowski coil, the current measurement device configured to combine signals from the shunt resistor and the Rogowski coil. The current measurement device may have a Rogowski coil on a flexible substrate at least partially wrapped around the shunt. A current measurement device has a rigid substrate, vias filled with a conductive material through the rigid substrate, conductive layers on the top surface and the bottom surface connecting to the vias to form a Rogowski coil structure, one or more insulative layers directly on the coil structure, a shunt resistor directly on the one or more insulative layers.

19 Claims, 29 Drawing Sheets

Related U.S. Application Data a continuation-in-part of application No. 18/198,800, filed on May 17, 2023.

(60) Provisional application No. 63/580,970, filed on Sep. 6, 2023, provisional application No. 63/516,093, filed on Jul. 27, 2023, provisional application No. 63/515,570, filed on Jul. 25, 2023, provisional application No. 63/400,831, filed on Aug. 25, 2022, provisional application No. 63/392,471, filed on Jul. 26, 2022, provisional application No. 63/344,981, filed on May 23, 2022.

(58) Field of Classification Search
USPC ................................................ 324/126, 127
See application file for complete search history.

(56) References Cited

U.S. PATENT DOCUMENTS

| | | | |
|---|---|---|---|
| 9,136,786 B2 | 9/2015 | McLean et al. | |
| 9,201,104 B2 | 12/2015 | Jackson et al. | |
| 9,322,850 B2 | 4/2016 | Wood et al. | |
| 10,746,767 B2 | 8/2020 | Worones et al. | |
| 2014/0253102 A1* | 9/2014 | Wood ..................... | G01R 1/203 |
| | | | 324/140 R |
| 2015/0268280 A1* | 9/2015 | Miljanic .............. | G01R 15/185 |
| | | | 324/127 |
| 2023/0001514 A1 | 1/2023 | Heralic et al. | |

FOREIGN PATENT DOCUMENTS

| | | | | | |
|---|---|---|---|---|---|
| KR | 20060005205 A | * | 1/2006 | ......... | G01R 19/0069 |
| KR | 20160014020 A | * | 2/2016 | ........... | G01R 15/146 |
| WO | WO-2020055409 A1 | * | 3/2020 | ....... | G01R 19/16547 |

* cited by examiner

1202

1204

1206

1208

1204

1210

1214

1200

1280 — MASK AND PATTERN RIGID SUBSTRATE WITH A VIA PATTERN

1282 — BAKE SUBSTRATE TO CONVERT TO CERAMIC

1284 — REMOVE PORTIONS OF THE SUBSTRATE TO FORM HOLES

1286 — DEPOSIT CONDUCTIVE MATERIAL IN VIAS

1288 — DEPOSIT CONDUCTIVE MATERIAL ON TOP AND BOTTOM SURFACES

1290 — MASK AND PATTERN CONDUCTIVE MATERIAL TO FORM COIL STRUCTURE AND CONTACT PADS

1292 — CONNECT SHUNT RESISTOR

CURRENT MONITOR COMBINING A SHUNT RESISTOR WITH A ROGOWSKI COIL

CROSS-REFERENCE TO RELATED APPLICATION

This disclosure is a continuation-in-part of U.S. Non-provisional patent application Ser. No. 18/198,800, titled "SHUNT FOR USE IN BUSBAR-TO-MODULE CON-NECTIONS," filed on May 17, 2023, which claims benefit of U.S. Provisional Application No. 63/400,831, titled "LOW INSERTION INDUCTANCE HIGH-POWER BUS-BAR CURRENT SHUNT," filed on Aug. 25, 2022, and U.S. Provisional Application No. 63/344,981, titled "COAXIAL SHUNT FOR USE IN BUSBAR-TO-MODULE CONNEC-TIONS," filed on May 23, 2022. This disclosure is also a continuation-in-part of U.S. Non-provisional application Ser. No. 18/225,034, titled "CURRENT MONITOR COM-BINING A SHUNT RESISTOR WITH A ROGOWSKI COIL," filed on Jul. 21, 2023, which claims benefit of U.S. Provisional Application No. 63/392,471, titled "CURRENT MONITOR COMBINING A SHUNT RESISTOR WITH A ROGOWSKI COIL," filed on Jul. 26, 2022. This disclosure also claims benefit of U.S. Provisional Application No. 63/515,570, titled "WASHER SHUNT WITH A ROGOWSKI COIL FOR MEASURING CURRENT IN A DEVICE UNDER TEST," filed on Jul. 25, 2023, U.S. Provisional Application No. 63/516,093, titled "CURRENT MONITOR COMBINING A SHUNT RESISTOR WITH A ROGOWSKI COIL USING THIN FILM PROCESS," filed on Jul. 27, 2023, and U.S. Provisional Application No. 63/580,970, titled "FLEX CIRCUIT INCLUDING A ROGOWSKI COIL," filed on Sep. 6, 2023. The disclosures of all the above-referenced applications are incorporated herein by reference in their entirety.

TECHNICAL FIELD

This disclosure relates to test and measurement systems, and more particularly to devices and methods for measuring or monitoring electrical currents.

BACKGROUND

High-power switching devices are often built in module form, with screw terminals to connect with busbars for the high-current terminals. To support rapid current changes when switching transients, capacitor banks are usually mounted on the busbars, and usually close to the modules to minimize series inductance. This then leads to difficulties inserting a current measurement device between the capaci-tor bank and the module to measure the switching transients, as it may insert so much inductance as to change the transient being measured.

Various approaches have addressed this problem, but all have presented their own disadvantages. For instance, one solution employs Rogowski coils around the busbar. Rogowski coils lack DC capabilities, have limited band-width, and can present accuracy problems dependent on the position of the coil. Similarly, another solution uses current transformers around an extension post between the busbar and the module. However, current transformers may add inductance in addition to lacking DC capabilities and typi-cally have limited bandwidth.

Another approach inserts a coaxial shunt into a gap in the busbar. Typically, these coaxial shunts have three concentric conductors in a cylindrical shape: a return path on the outside, a resistive shunt material in the middle, and a sense lead running through the innermost portion of the coaxial shunt. Such coaxial shunts constrain magnetic field between the outer and middle materials to cancel any inductance affecting the sense lead, and they allow for DC coupling and broad measurement bandwidth. But these shunts can be difficult to insert into gaps in busbars and can extend the electrical path such that unwanted inductance is inserted in the current path.

Large and rapidly changing currents, such as are common in switching power supplies and motor drives using Wide Band Gap semiconductors (and in lightning or other arc discharges), are notoriously difficult to measure accurately.

One approach often used is to place a series resistor (or "shunt") in the current path, measure the voltage drop caused by the current, and divide by the resistance. This approach handles DC and lower frequencies well, but suffers at higher frequencies due to the inductive drop across the shunt, which exceeds the resistive drop for frequencies above a frequency $f_c$:

$$V = R \cdot i + L \cdot \frac{di}{dt} \quad f_c = \frac{R}{2\pi \cdot L}$$

When measuring large currents, a relatively small shunt resistance R is needed to keep the voltage drop and power dissipation of the shunt within reason, which leads to objectionably low usable bandwidth $f_c$.

The inductive drop can be eliminated by using a coaxial shunt, in which the resistive element is a cylinder, the return current passes through a larger and concentric outer cylinder, and the voltage measurement leads are routed out from the shunt inside the resistive cylinder. The symmetrical nature and the outer return current path ensure the magnetic field generated by the current circles between the shunt and the outer return path, leaving no magnetic field to impart an inductive drop on the measured voltage inside the shunt. Coaxial shunts eliminate measurement inductance (induc-tance included in the measured voltage drop), but require a longer current path through the shunt, thus increasing the insertion inductance (inductance inserted in the current path of the system under test). Even with no measurement inductance, coaxial shunts have limited bandwidth due to the skin effect of the shunt material. As frequency increases, the skin depth of electric current in a conductor decreases. Once the skin depth approaches the thickness of the resistive cylinder, a significantly lower portion of the current flows on the inside of the shunt, generating less resistive drop on the inside where the voltage is measured.

Another method to improve the usable bandwidth of a shunt is to add a canceling mutual inductance $M_c$ in the lead dress of the voltage measurement leads of a conventional shunt:

$$V = R \cdot i + L \cdot \frac{di}{dt} - M_C \cdot \frac{di}{dt}$$

This minimizes the insertion inductance by not requiring a particular return current path but is trickier to implement because the return current path must still be known to determine lead placement to achieve cancelation ($M_C = L$). The cancellation approach also suffers at high frequency due to skin effect: the current path through the shunt will shift in physical location as the skin depth approaches the shunt thickness, changing $M_C$, L, & R.

Another current measurement approach is to sense the magnetic field along a closed loop encircling the current to be measured. A Rogowski coil senses the time derivative of this magnetic field; the voltage induced on the Rogowski coil can then be integrated to determine the current flow. Rogowski coils have the advantage of inherent isolation and relative ease of installation but cannot measure DC current. In fact, there is a trade-off between the low-frequency usable range and the high-frequency bandwidth of a Rogowski coil. Achieving low frequency coverage suggests a large mutual inductance between the coil and the current flow to maximize the coil voltage at low di/dt, whereas high bandwidth suggests a small self-inductance of the coil to minimize its time constant driving the load impedance of the integrator.

Configurations of the disclosed technology address shortcomings in the prior art.

DESCRIPTION

Embodiments here involve a test and measurement accessory device including shunt structured to be inserted between a busbar and module. The accessory device enables measurement of a voltage drop across the shunt, and therefore, using the known resistance of the device, measurement of a current flowing between the busbar and the module. Some embodiments of the shunt are structured as a washer with a sense lead running through an inner portion, or opening, of the shunt. As discussed in further detail below, embodiments of the shunt minimize electrical path length and consequently minimize inductance inserted into the current path, while maintaining DC capabilities and broad measurement bandwidth benefits of traditional shunt resistors.

Figures 1A, 1B:
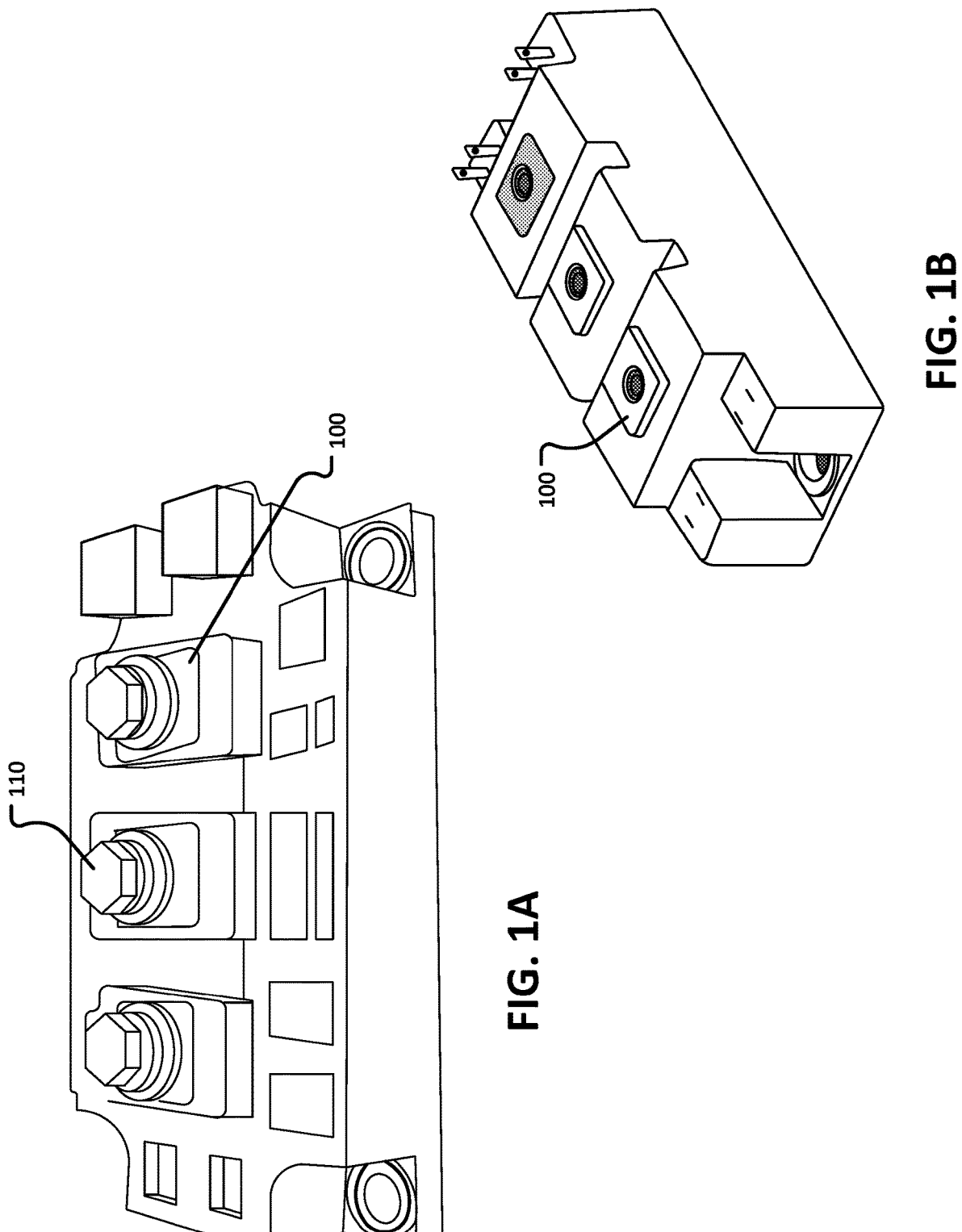
FIG. 1A shows a screw terminal of a switching device module.
FIG. 1B shows an additional example of a screw terminal of a switching device module.

FIGS. 1A and 1B show a module for a high-power switching device having a screw terminal 100 to connect the module to a busbar (not shown in FIGS. 1A and 1B). The screw terminal 100 includes a bolt 110 for mechanically attaching the busbar to the screw terminal 100 and for providing a current path between the module and the busbar. To support rapid current changes when switching transients, a capacitor bank may be mounted on the busbar, and it may be mounted close to the module to minimize series inductance. However, this may lead to difficulties inserting a current measurement device between the capacitor bank and the module to measure the switching transients, as it may insert so much inductance as to change the transient being measured.

Figure 2:
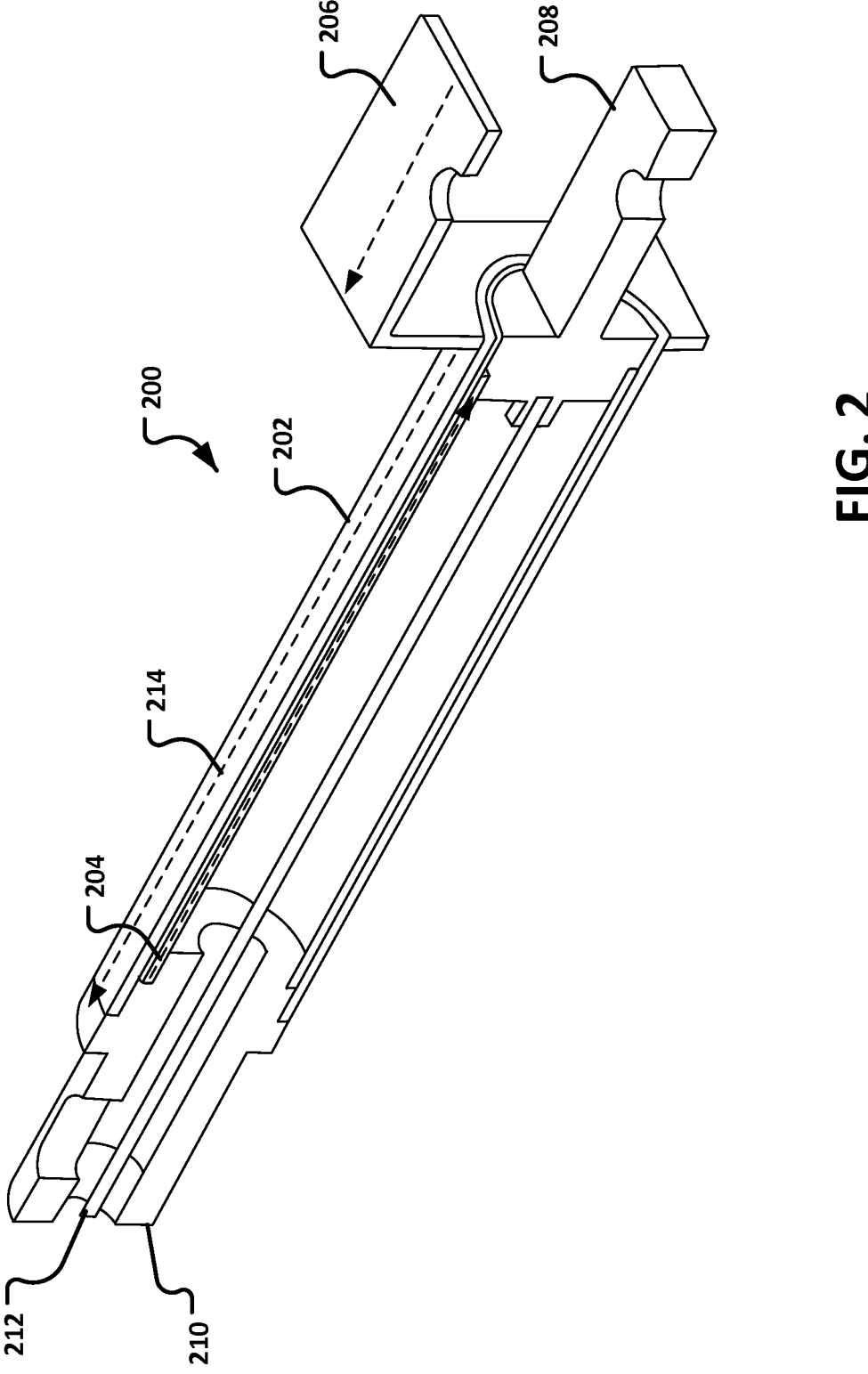
FIG. 2 shows an example of a conventional coaxial shunt.

FIG. 2 shows a cross section of an example of a conventional coaxial shunt 200 used to measure a voltage drop across the shunt. The shunt comprises coaxial cylinders. An outer cylinder 202 will typically consist of copper, and the inner cylinder 204 made of manganin. The pins 206 and 208 are current pins, and pins 210 and 212 are the voltage pins. The center pin or sense lead 212 is in the center of the coaxial shunt. An issue that arises with this type of structure lies in the current path. The current flows along the line shown at 214 through the current pin 206 and along the outer cylinder 202. This relatively long current path adds to the overall electrical path length of the circuit or device being measured. This inserts inductance into the path, which may change the transient being measured. As discussed below, the embodiments here minimize any length added to the current path.

Figure 3:
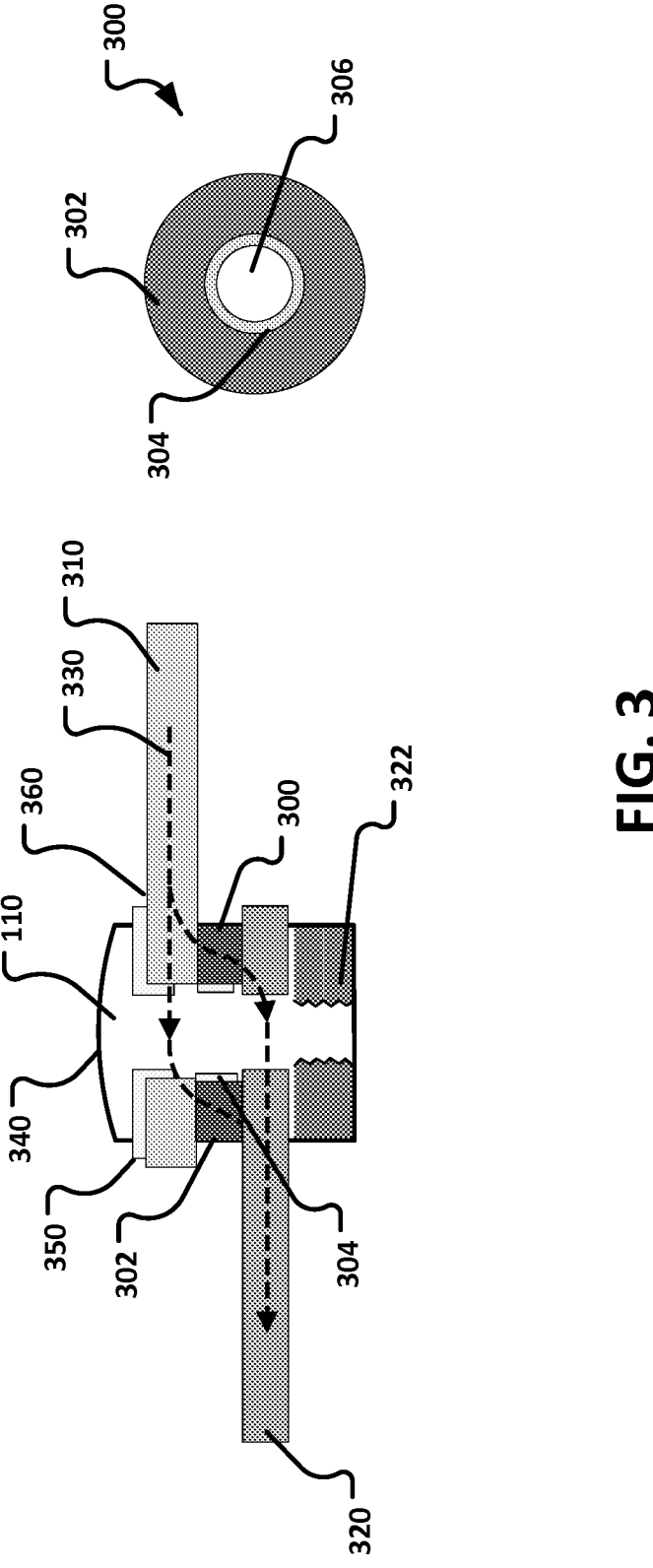
FIG. 3 shows a cross sectional view of a busbar and module connection with an embodiment of a shunt as inserted.

FIG. 3 shows a test and measurement accessory comprising a shunt 300 to be inserted between a busbar 310 and a screw terminal 320 of an electronic module, such as the modules shown in FIGS. 1A and 1B. The screw terminal 320 may be an example of, or similar to, the screw terminal 100 show in FIGS. 1A and 1B but is shown elongated in FIG. 3 to better illustrate the current path through the assembled components. The shunt 300 includes an opening 306, such as a hole that extends through the shunt. An embodiment of the shunt 300 is shaped such that it resembles a washer. The shunt 300, with its washer-like shape, includes a resistive portion 302, and may also include an insulative portion 304 in some embodiments.

In some embodiments, the resistive portion 302 surrounds the insulative portion 304, creating outer and inner layers of the shunt 300. The shunt 300 may be between the screw terminal 320 and the busbar 310 and provides a current path 330 between the busbar 310 and screw terminal 320 of the electronic module through the shunt 300. Specifically, the resistive portion 302 of the shunt is configured to form a portion of the current path 330. A bolt 110 may then be inserted through the busbar 310 and through the opening 306 of shunt 300 and fastened into the threaded portion 322 of screw terminal 320. This secures the shunt 300 between the busbar 310 and the screw terminal 320 and creates good electrical contact between these components.

This bolt 110 may serve as one contact 340 for the shunt to allow sensing of the voltage at the "bottom" end of the shunt 300, the end of the shunt 300 contacting the screw terminal 320. A second contact may be located on or connected directly to busbar 310, for example at location 360, to sense the voltage at the "top" end of the shunt 300, the end of the shunt 300 contacting the busbar 310. The resistive portion 302 causes a voltage drop across the shunt 300, which can be measured at the first and second contacts. The measured voltage drop, together with the known resistance value of the shunt, can be used to determine the current flowing through the shunt, and therefore the current flowing between busbar 310 and screw terminal 320 of the module.

The bolt 110 extends through the opening 306 of the shunt to conveniently act as a sense lead and provide the contact 340 at the same "top" surface of the assembled accessory device as the second contact 360. The contact 340 and the bolt 110 are electrically insulated from the resistive portion 302 of the shunt. In some embodiments, an insulative portion 304 of the shunt 300 electrically insulates the contact 340 from the resistive portion 302. In some embodiments, an air gap electrically insulates the contact 340 from the resistive portion 302. However, without insulating layer 304 it may be more challenging to install shunt 300 and maintain an air gap to prevent the bolt 110 from shorting to the resistive portion 302 of the shunt 300 while tightening the bolt. Some embodiments include both an insulative portion 304 of the shunt and an air gap.

Figure 4:
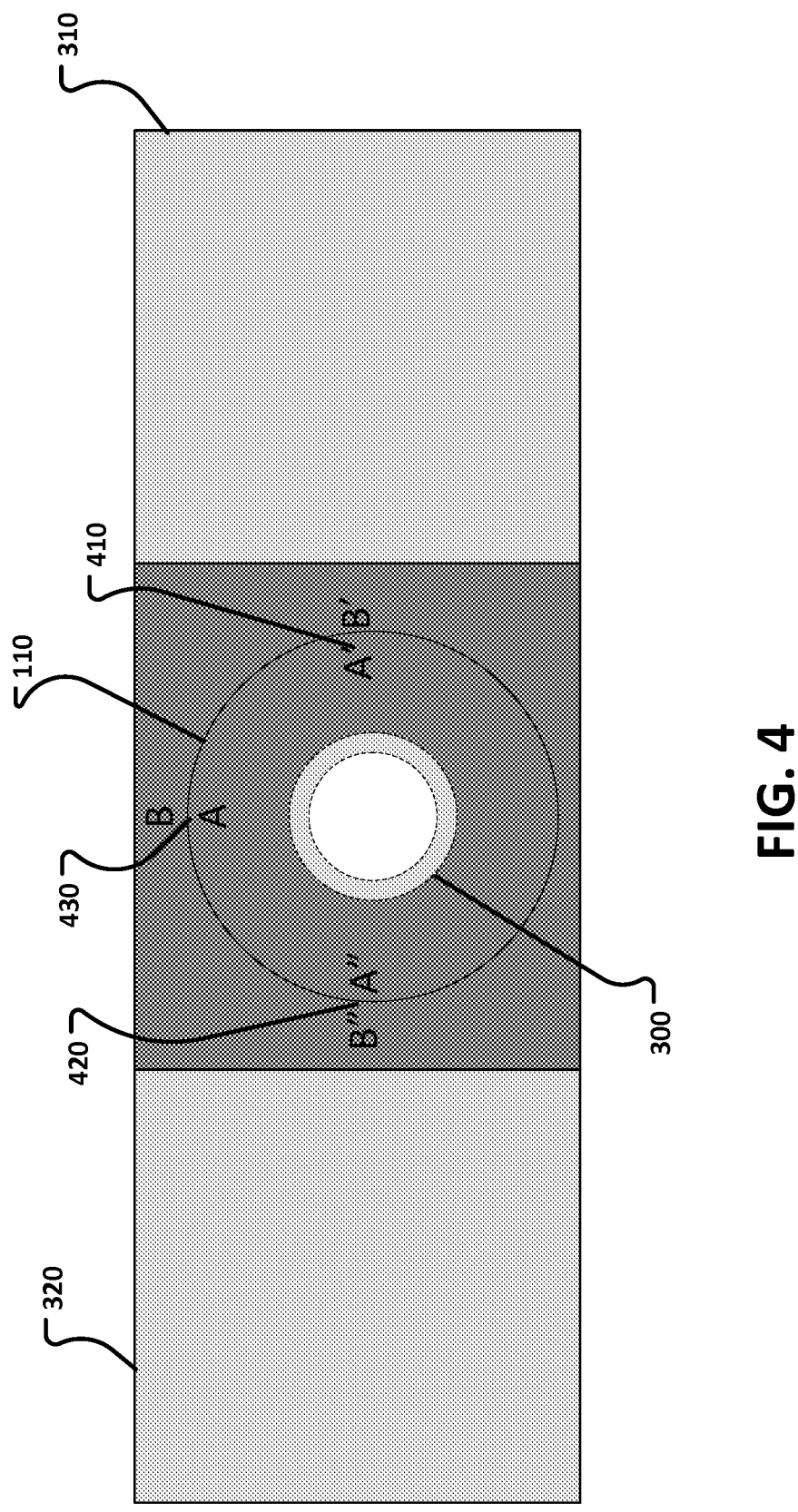
FIG. 4 shows a top view of the busbar and module connection of FIG. 3.

FIG. 4 shows a top view of the assembly of FIG. 3, in which the busbar 310 mechanically fastens to the screw terminal 320 of the electronic module, and between which the shunt 300 is inserted. As discussed, embodiments of the disclosure may utilize bolt 110 as one sense lead for the shunt 300 and busbar 310 as another sense lead, providing contact surfaces for taking measurements, e.g., by connecting cables, leads of a test probe, or other measurement leads of a test and measurement instrument. The contacts allow measurement of a voltage drop across the shunt that can later be converted to a current measurement. Measurement leads contacting the contact surfaces may nonetheless be sensitive to magnetic flux from the current flow through the busbar, as current crowding on the module side may cause some magnetic field to loop through bolt 110. Consequently, the specific location of the two or more contacts for the measurement leads on the contact surface of bolt 110 and busbar 310 may change the measurement due to the magnetic field looping through the bolt 110.

For instance, as illustrated in FIG. 4, measurement leads contacting bolt 110 and busbar 310 at a first location 410, represented with A' and B,' and a second location 420, represented with A" and B," may enclose some loop area sensitive to magnetic flux. The locations labeled with variations of A reside on the bolt, and the variations of B reside on the busbar 310. Because the polarity of the magnetic pickup will change between the measurement locations, a third measurement location 430, represented with A and B, may serve as an intermediate location that experiences a minimal magnetic pickup in the measurement leads. The specific location of this third measurement location 430 may depend on factors such as thickness of the shunt 300, shown as dashed lines because it lies under the top of the bolt and the busbar 310, and the specific current path in busbar 310 screw terminal 320 of the electronic module.

However, in general, embodiments will have first and second contacts 340, 360 of sufficient size to allow for some intermediate location for placement of the measurement leads that reduces effects of magnetic flux. Because the washer-like shape of the shunt 300 maintains a relatively flat profile, it minimizes the additional length of the current path from the shunt 300 compared to traditional shunt components. Minimizing the current path across shunt 300 in this way reduces the additional inductance being inserted into the current path. Accordingly, utilizing the shunt 300 and carefully placing measurement leads may minimize two potential sources of measurement error in high-power switching devices.

Figures 5, 6:
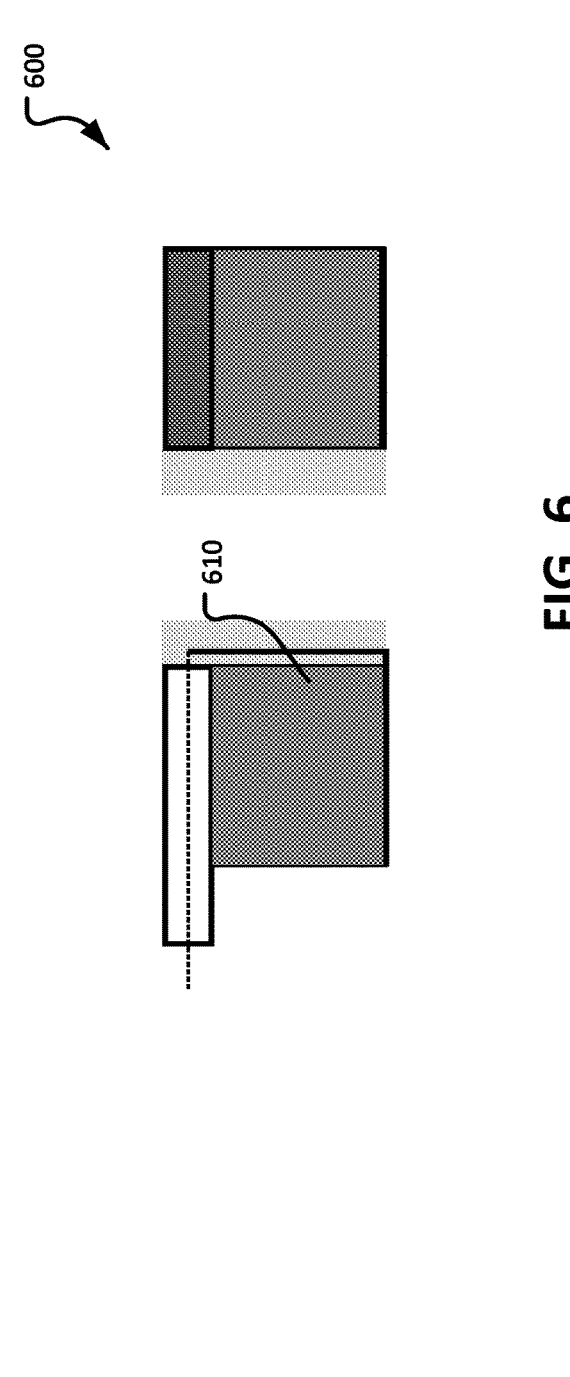
FIG. 5 shows a cross sectional view of a component of the shunt of FIG. 3.
FIG. 6 shows a cross sectional view of another embodiment of a shunt.

Additionally, in embodiments of the shunt 300 shown in FIG. 3, an insulating shoulder washer 350 may be included. This insulating shoulder washer 350 may reside with the shunt 300 and may have a portion parallel to the busbar 310 to be placed between the bolt 110 and the busbar 310. As shown in FIG. 5, the insulating shoulder washer 350 may also include conductive portions 356 and 358 to contact the busbar 310 and bolt 110 from FIG. 3. The conductive portions 356 and 358 may comprise pins 352 and 354, represented with A and B in FIG. 5. Pins 352, 354 may provide connection locations for measuring a voltage between points A and B, which includes the voltage drop across the shunt 300 and the voltage drop due to the contact resistance of the shunt 300 to the busbar 310 above and screw terminal 320 below. The pins 352, 354, together with conductive portions 356, 358 and busbar 310 and bolt 110 form at least two contacts for measuring the voltage drop across the assembled components. Like the measurement locations described in relation to FIG. 4, a user may rotate the shoulder washer 350 to adjust the specific location of the pins 352 and 354 to minimize magnetic flux pickup before fully fastening the bolt 110 to the screw terminal 320. In both the examples of FIGS. 4 and 5, the optimum rotation location may be found experimentally by minimizing high frequency content in the measured voltage. The magnetic pickup (proportional to di/dt) is always in quadrature to the resistive drop, independent of polarity, and thus can only artificially increase high frequency content. Thus minimum high frequency content as a function of rotation coincides with zero magnetic pickup.

FIG. 6 shows another example of shunt 600. The shunt 600 is similar to the shunt 300, including a resistive portion 602 and an insulative portion 604, but comprises a Kelvin sense configuration having a sense lead 610 on the shunt 600 itself. The sense lead 610 resides on an inner portion of the shunt 600, running parallel to the center axis of the shunt 600, for example, through the insulative portion 604. In this way, having the sense lead 610 on the shunt 600 itself may avoid measuring the voltage drop across the contact resistance between the shunt 600 and the busbar and module shown in FIG. 3. Additionally, running the sense lead 610 through an inner portion of the shunt 600 may minimize magnetic flux pickup.

The embodiments of a shunt here each have an opening through which one of the sense leads will extend. While this is like the current example of a shunt given above, the sense lead here is configured to be part of the current path such that length added to the current path is minimized, in contrast to the length of the current path shown in FIG. 2.

Figure 7:
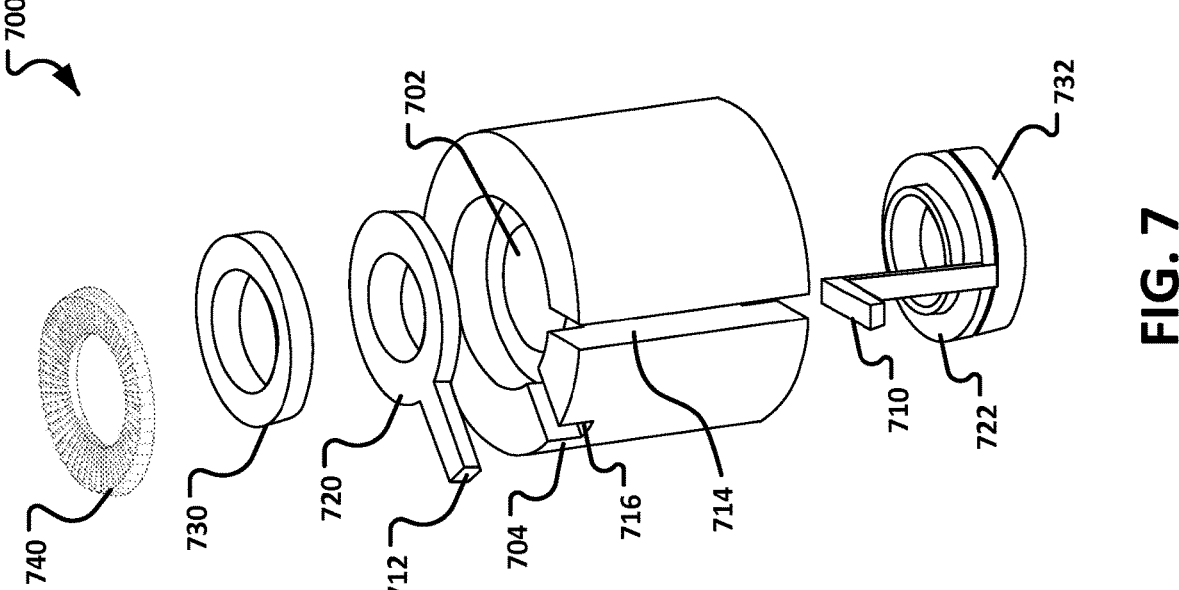
FIG. 7 shows an embodiment of a shunt.

FIG. 7 shows an embodiment of a shunt 700. In the embodiment, the shunt 700 may still include a resistive portion 702 and an insulative portion 704. The insulative portion 704 may comprise a ceramic washer, and the resistive portion 702 may comprise a resistive material on a surface of the ceramic washer, for example, painted on an inner surface of the ceramic washer as shown. One example material for the ceramic washer may be CoorsTek YTZP zirconia, but many other materials are also usable in embodiments to provide a structural substrate for the resistive material. First and second conductive elements 720 and 722 may also be included in embodiments, with the first conductive element 720 placed on a top surface of the ceramic washer that forms the insulative portion 704 and the second conductive element 722 placed on a bottom surface. Conductive elements 720, 722 may be formed of gold or other metals, for example, and may be electrically connected to the resistive portion 702 by solder or brazing, for example. Additionally, rather than the bolt of the screw terminal, not shown in FIG. 7, serving as the sense lead, a first sense lead 710 provides one contact for measurement leads and extends from the conductive element 722 on the bottom surface nearest the electronic module from FIGS. 1A and 1B to the top of shunt 700, nearest the busbar, shown in FIG. 3. The conductive material forming this sense lead contact 710 may be run vertically, parallel to a center axis of the shunt 700, but insulated from the painted circuit forming the resistive portion 702. In this way, the first sense lead extends through an opening in inner portion of the shunt 700. The sense lead 710 generally extends vertically through the thickness or height of the ceramic washer, although it is illustrated with an exaggerated height in FIG. 7.

A second sense lead 712 provides another contact, formed by extending a conductive material from the conductive element 720 on the top surface. The ceramic washer forming the insulative portion 704 may also include a first slot 714 and a second slot 716 for receiving the first sense lead 710 and the second sense lead 712, respectively. As illustrated, the conductive element 720 placed on the top surface of the ceramic washer that forms the insulative portion 704 may have a gap aligned with the slot 714, the gap preventing the sense lead 710 from contacting the top conductive element 720. By rotating the shunt 700, a user may position the first sense lead 710 and second sense lead 712 such that they experience minimal magnetic pickup from the magnetic field looping through the shunt 700.

The embodiment of FIG. 7 may also include at least one compressible conductive gasket 730. For instance, a compressible conductive gasket 730 may reside on a top surface of the top conductive element 720, between the shunt 700 and the busbar 310. An additional compressible conductive gasket 732 may reside on a bottom surface of the bottom conductive element 722, between the shunt 700 and the bottom of the screw terminal 320 of the electronic module. A compressible conductive gasket may reside in either of the configurations described above, or both, and may protect the shunt 700 from the compression force of the mechanical attachment such as the screw force of the screw terminal.

Finally, the embodiment of FIG. 7 may include at least one conductive locking washer 740. Although FIG. 7 illustrates a single locking washer 740 placed at the top of the shunt 700, embodiments may have a locking washer on either the top or bottom, or both. Locking washer(s) may replace one or more of the compressible conductive gaskets.

Figures 8, 9:
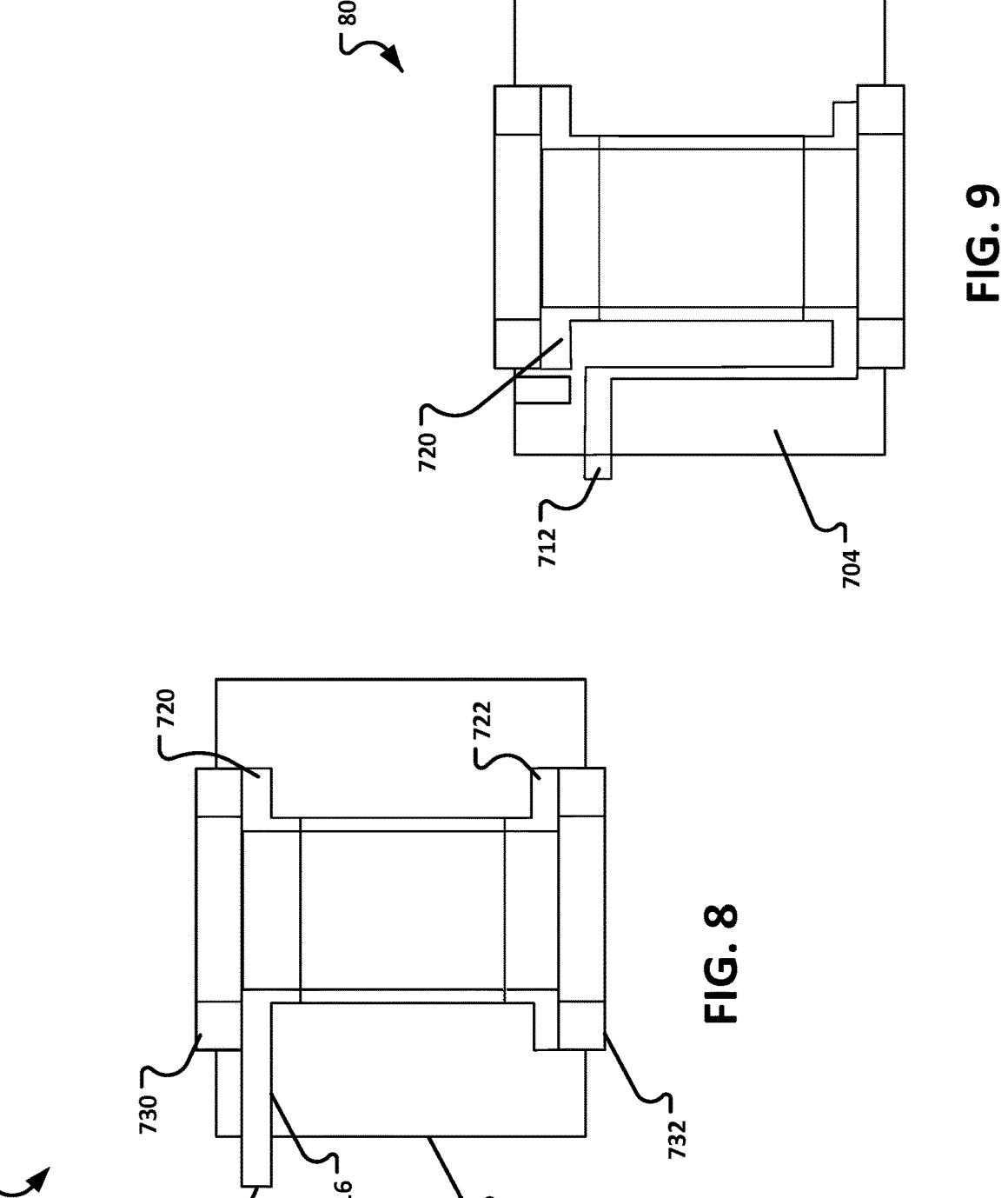
FIGS. 8 and 9 show alternative embodiments of a shunt.

FIG. 8 shows a cross sectional view of another embodiment of shunt 700. As shown, embodiments of the shunt 700 may be assembled with optional compressible conductive gaskets 730 and 732 on both the top and bottom surfaces of the shunt 700 to protect the insulative portion 704 from compressive force. Additionally, in embodiments, the second sense lead 712 connected to the top conductive element 720 may extend through a second slot 716 in the insulative portion 704 and out the side of the shunt 700. The first sense lead 710 from bottom conductive element 722 the is not visible in the illustrated cross section of FIG. 8, as the first sense lead 710 extends through the insulative portion 704 and out the side of the shunt 700 at a different circumferential position on the shunt 700 relative to the second sense lead 712. Put differently, in the view shown in FIG. 8, the first sense lead 710 resides in and exits from a portion of the shunt 700 hidden to illustrate the cross section.

FIG. 9 shows an rotated cross sectional view of the shunt 700. In this view, the first sense lead 710 exits through an opening in the insulative portion 704 to the side, separated from the top conductive element 720 by a portion of the insulative portion 704.

Figure 10B:
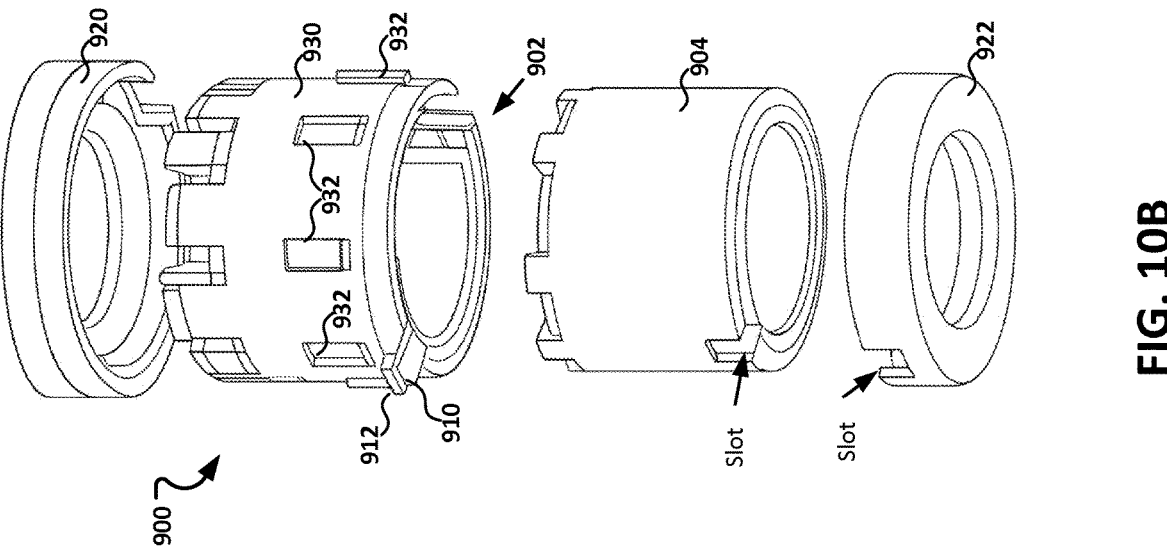
FIG. 10A and FIG. 10B show views of an embodiment of a shunt.
Figure 10A:
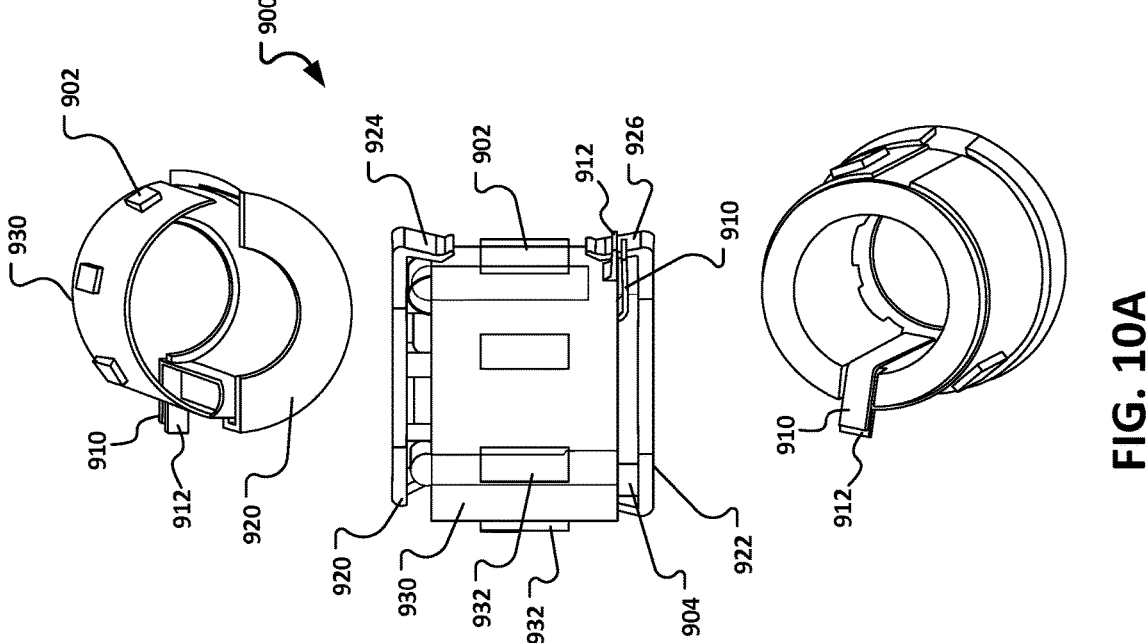

In another embodiment, shown in FIG. 10A and FIG. 10B, a shunt 900 comprises a resistive portion 902, formed of a plurality of resistors 932 mounted on a flex circuit 930, and an insulative portion 904. The resistive portion 902 may comprise an outer layer surrounding the insulative portion 904. According to this embodiment, conductive elements 920 and 922 may be placed on both the top and bottom surfaces of the shunt 900. Each conductive element may contact the insulative portion 904 for mechanical support and may contact the resistive portion 902 using one or more clips. For example, clip 924 extends from the conductive element 920 in the direction of the opposite conductive element 922, and clip 926 extends from the conductive element 922 in the direction of the conductive element 920. Each clip 924 or 926 has a structure to allow the conductive element, or caps, to contact the flex circuit 930 and provide a conductive path across the shunt 900 through the resistive portion 902. Additionally, each conductive element 920 or 922 may have a structure to share a center axis with the shunt 900 and may be rotated about the axis without the respective clip 924 or 926 losing contact with the flex circuit 930.

A first sense lead contact 910 may be provided, running from the bottom conductive element 922 through the inside of the opening of the shunt 900, and out a slot near the bottom of the shunt 900, shown in the view on the bottom right. In this embodiment, the sense leads may be fully built into the flex circuit. A second sense lead 912 may extend from the top conductive element 920, shown in the view on the top right. By rotating the shunt 900, a user may position the first sense lead 910 and second sense lead 912 such that the measurement leads will experience minimal magnetic pickup from the magnetic field looping through the shunt 900.

Figure 11:
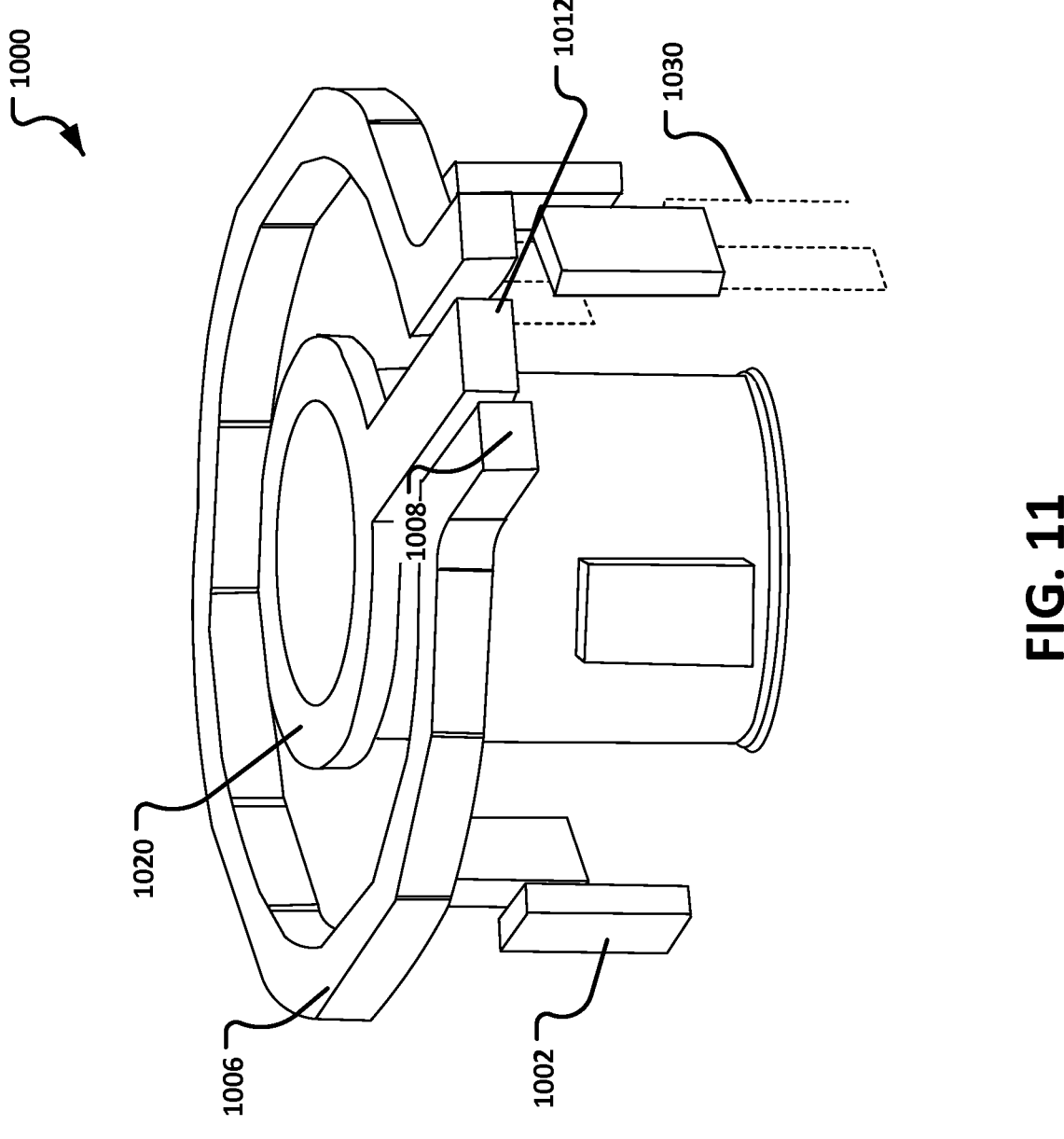
FIG. 11 shows a view of components of an embodiment of a shunt.
Figure 12:
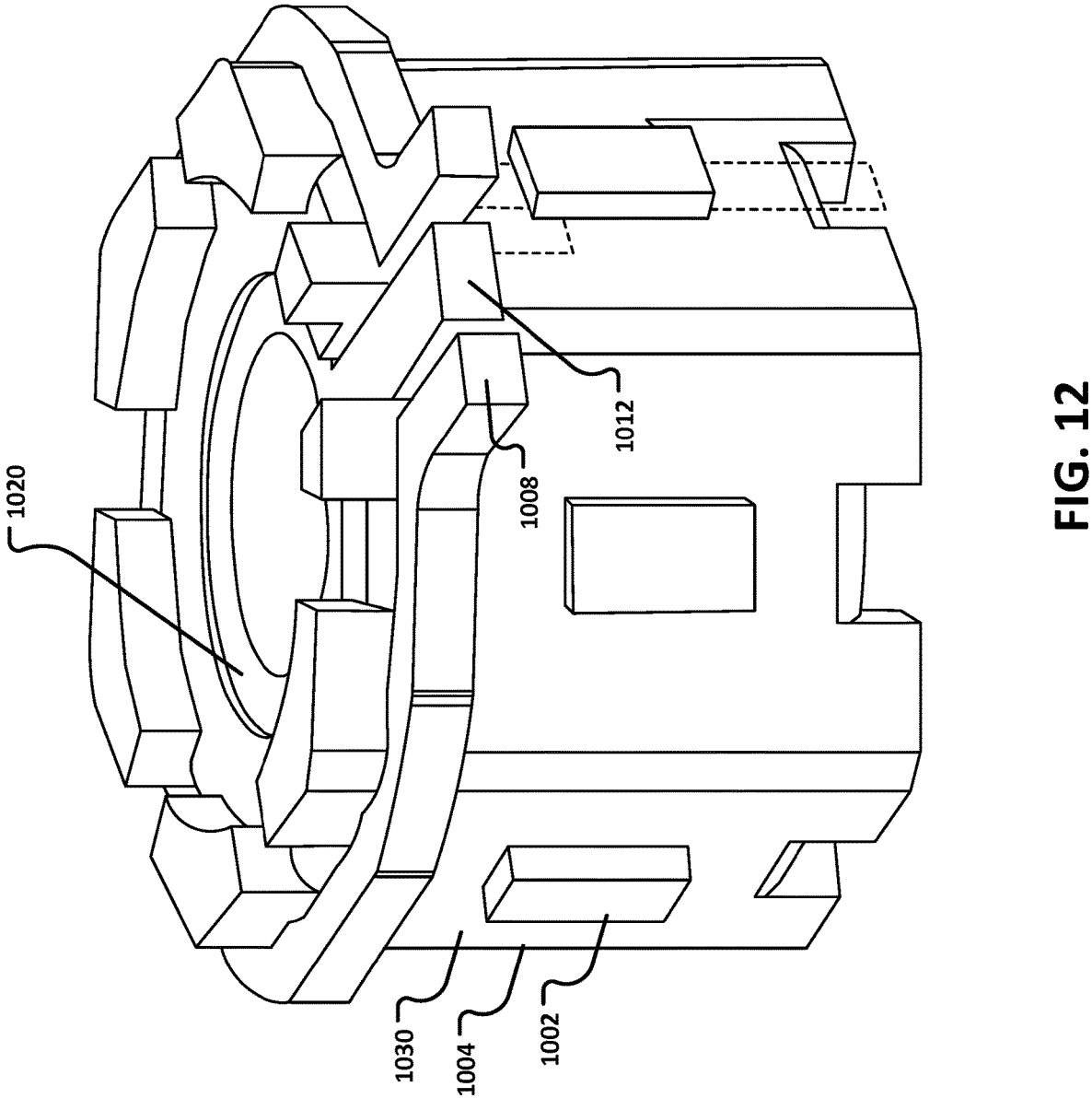
FIG. 12 shows a view of the shunt of FIG. 11.

FIGS. 11 and 12 illustrate another embodiment of a shunt 1000. FIG. 12 shows the ceramic insulative portion 1004, which provides a structural substrate for the shunt 1000, but in FIG. 11 it has been removed to show the sense line leads and the resistors. The conductive element 1020 connects to the high side of the resistive portion 1002 and has a sense lead portion 1012 as one of the contacts. The resistive portion 1002 in this embodiment comprises resistors that may have a circuit 1030. The hexagonal conductive element 1006 electrically connects to the low side of the resistors and has a second sense lead such as 1008, that extends up through the opening on the inside of the shunt 100, and that comes out on either side of the other sense lead 1012. FIG. 12 shows the assembly with the insulative portion 1004 comprising a ceramic washer upon which the resistors 1002 and circuit 1030 reside. The resistors and circuit may be painted on the exterior of the ceramic washer body 1004. By rotating the shunt 1000, a user may position the sense leads such that they experience minimal magnetic pickup from the magnetic field looping through the shunt 1000.

In this manner, the embodiments provide a test and measurement accessory for measurement of voltage in a current path between a busbar and a module without contributing much inductance to the measurement. The accessory comprises a shunt having an opening through which one of the sense leads extends. The shunt allows for measurement of a voltage drop across the shunt to be converted to a current measurement, while minimizing any additional path length that may affect the measurement.

Embodiments of the disclosure generally include measuring current using a device that includes a combined shunt and Rogowski coil. The output of the combined shunt and Rogowski coil may feed through a compensating pole, such as a passive RC or LR filter. Some embodiments may connect the output(s) of the current measurement device to an isolated probe. The embodiments involve inserting a shunt having sense leads into the current path to be measured. The current measurement device includes a Rogowski coil wrapped at least partially around the shunt. The current measurement device is configured to combine the output signals from the shunt and the Rogowski coil. In some embodiments, the Rogowski coil is placed in series with the shunt sense leads.

This configuration generates a voltage:

$$V = R \cdot i + L \cdot \frac{di}{dt} - M_C \cdot \frac{di}{dt} + M_R \cdot \frac{di}{dt}$$

where $M_R$ is the mutual inductance of the Rogowski coil to the current in the shunt. The coil is attached to the shunt sense leads as much as practical opposite the current return path. This avoids the strongest magnetic field and thereby creates a canceling mutual inductance $M_C$ roughly equal to L. Unlike $M_C$ and L, $M_R$ of a uniform Rogowski coil surrounding a conductor does not change with skin-depth-induced shifts in the current path.

By making $M_c{\approx}L$ and $M_R{>>}L{-}M_c$ one can closely approximate the voltage as:

$$V = R \cdot i + M_R \cdot \frac{di}{dt}$$

This represents a single-zero frequency response, and can be flattened with a single-pole compensator, such as an RC filter with the same time constant, meaning $R_f C_f{=}M_R/R$. At low frequencies, the R·i term dominates the shunt voltage, the compensating pole/RC filter is flat, and the shunt operates as a standard shunt. At high frequencies, the $M_R \cdot di/dt$ term dominates the shunt voltage, the compensating pole acts as the integrator for the Rogowski coil, and the final output voltage remains flat. The output voltage of the compensating pole may be measured by an isolated probe to maintain the isolation benefit of a Rogowski coil. The compensating pole may take many forms, including various architectures of RC (Resistor Capacitor) filters, or LR (Inductor Resistor) filters.

Since DC and low frequencies are handled by the shunt action, the Rogowski coil inductance may be optimized for high-frequency operation. This allows for a design with smaller coil inductance and higher frequency coverage than a stand-alone Rogowski coil.

Figure 13:
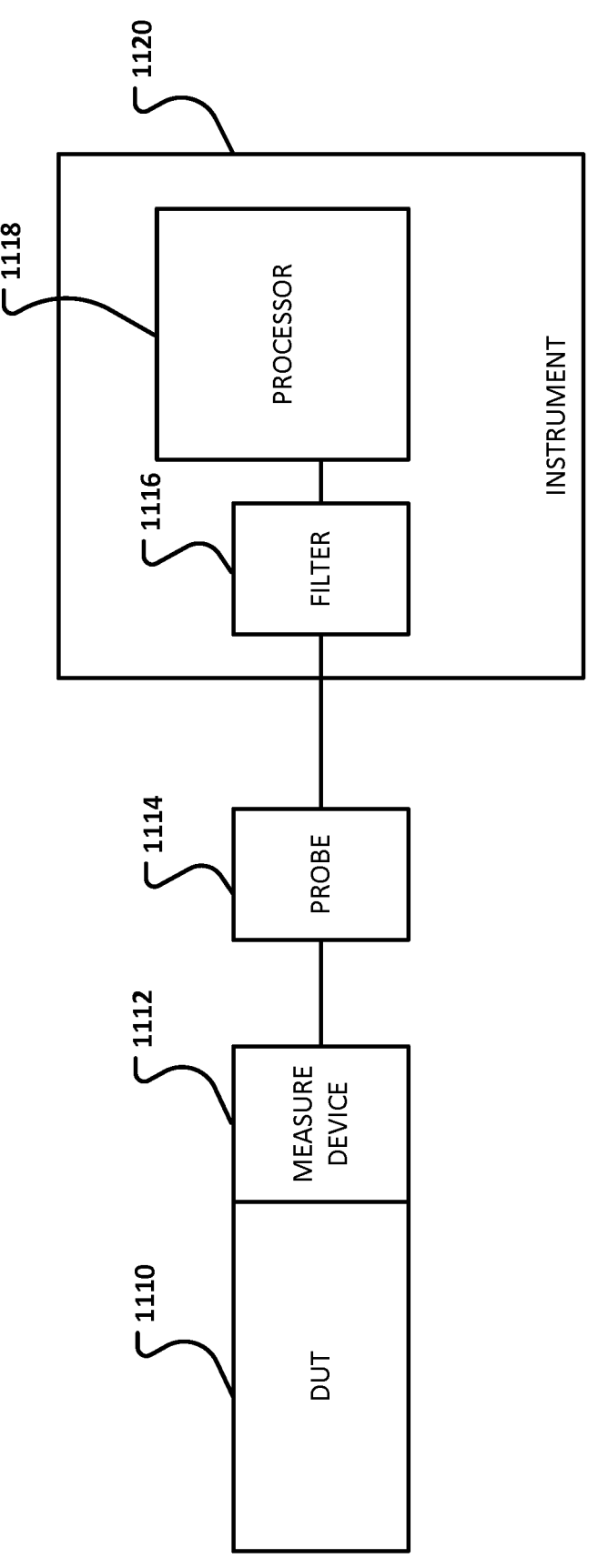
FIG. 13 shows a block diagram of a current measurement accessory within a test and measurement system.

FIG. 13 shows a block diagram of a test and measurement system that includes a current measurement device in the form of a current shunt. One should note that this diagram shows several components not needed for the current measurement device but provides context for various embodiments of the device. In FIG. 13, a device under test (DUT) 1110 has a current measurement device 1112 attached to it. The current measurement device may comprise a built-in or "solder-down" component, or an attachable/detachable component. The DUT will generally connect to the test and measurement instrument 1120 through one or more probes 1114. In some instances, the one or more probes may comprise "isolated probes" in which the probe is galvanically isolated from the instrument. For higher voltage and frequency operations, including those with wide-band gap (WBG) devices, isolated probes allow for more accurate measurements and reduce shock hazard.

As will be discussed in more detail later, one or more filters at the instrument level may receive the output of the measurement device 1112. These differ from the compensating pole filter discussed above. Filter 1116 may take the form of a separate component, such as a digital signal processor, or analog filter, or may result from the processor 1118 executing instructions to apply filtering to the incoming signal.

Figure 14B:
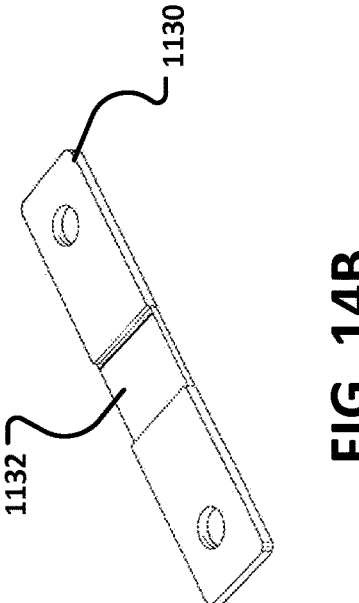
FIGS. 14A-14D show different embodiments of current shunts.
Figure 14D:
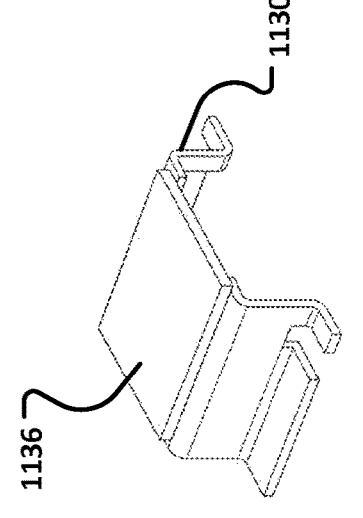
Figure 14D:
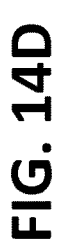
Figure 14A:
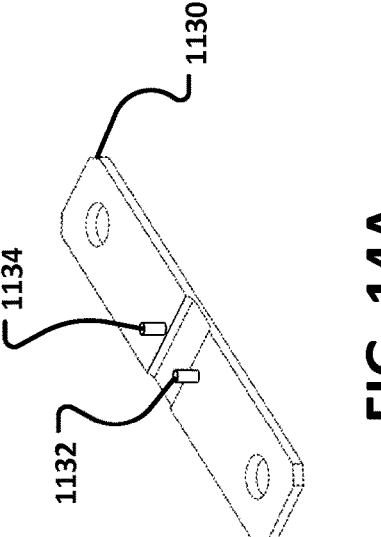
Figure 14C:
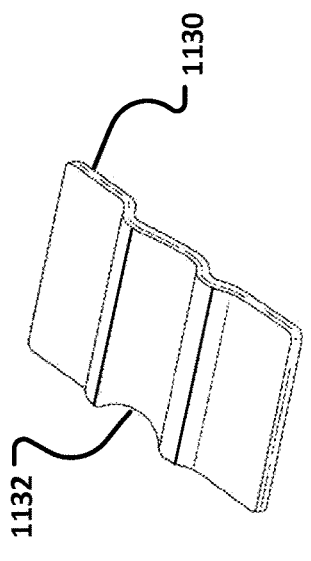

A Rogowski coil may be implemented in a flex circuit board of two (or more) layers, which can then be wrapped around and soldered onto a busbar or surface-mount metal-alloy shunt 1130 such as shown in FIGS. 14A-14D. The coil may wrap around the resistive portion 1132 or 1136 of the shunt 1130, which may typically be made of manganin. In the embodiment of FIG. 14A, the sense leads such as 1134 protrude from the shunt bar. FIGS. 14B-14D show different embodiments of the resistive portion 1132 or 1136 in the middle of copper portions.

Figures 15, 16:
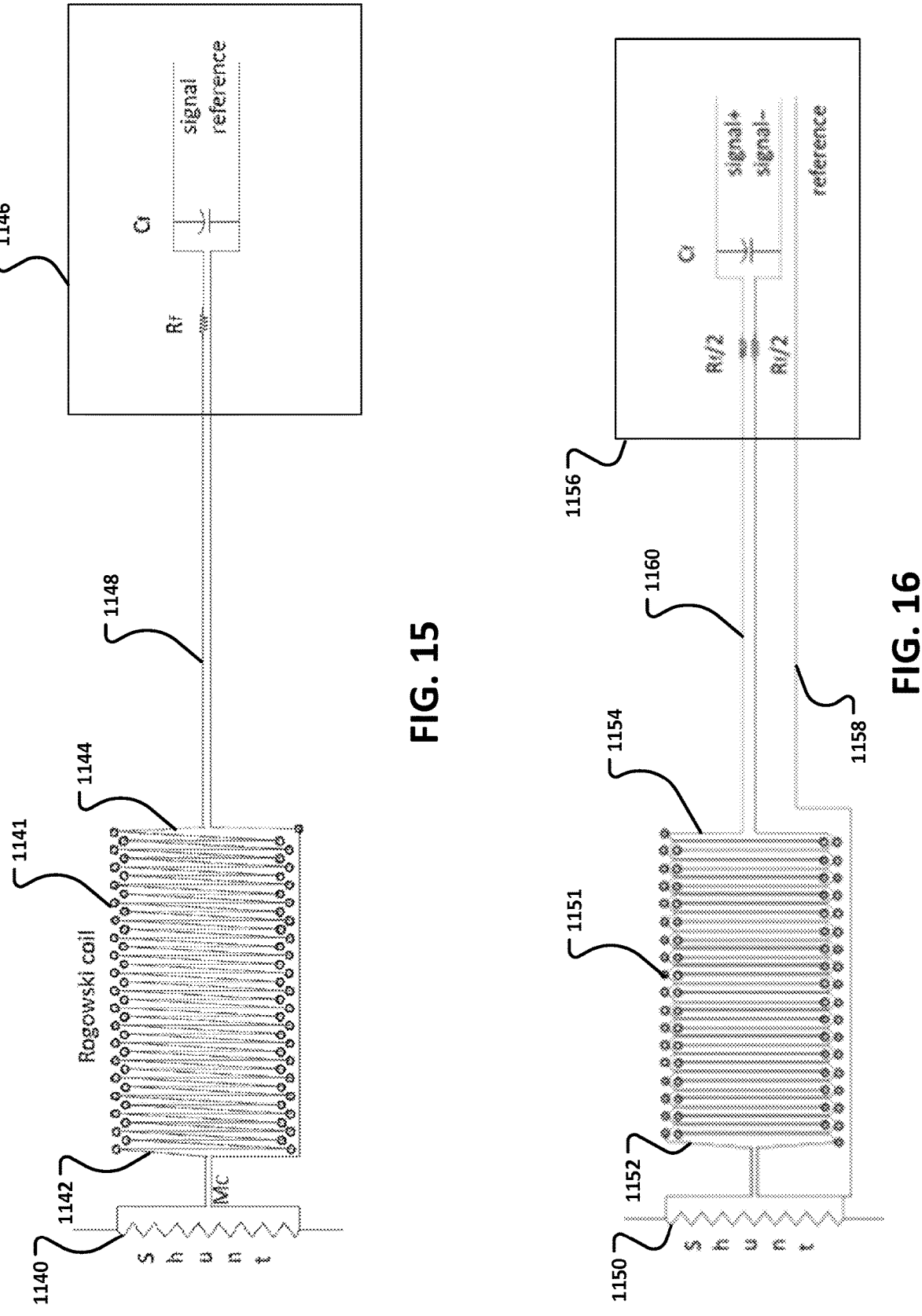
FIG. 15 shows an embodiment of a current shunt combined with a Rogowski coil.
FIG. 16 shows an alternative embodiment of a current shunt combined with a Rogowski coil.

FIGS. 15 and 16 show a current measurement device that includes a combined shunt having sense leads and a Rogowski coil, in different embodiments. In a single-ended implementation shown in FIG. 15, the reference, which may comprise the shield of the isolated probe or isolation barrier, may tie to one side of shunt 1140. The Rogowski coil 1141 may tie to the other side of the shunt, one end of $R_f$ to the coil, the other end of $R_f$ to $C_f$ and the input of the probe, and the other end of $C_f$ to the probe reference.

One set of traces, designated by 1142, are formed on one layer of the flex circuit nearest the shunt. The other set of traces, designated by 1144, are formed on the opposite side of the layer of the flex circuit further from the shunt. In some embodiments, the flex circuit may have an insulating layer or flexible dielectric core between the layer having traces 1142 and the layer having traces 1144, and in some embodiments may also have insulating layers as the topmost and bottommost layers of the flex circuit. The traces 1142 are connected to the traces 1144 by vias in the flex circuit so that the traces and the vias form a continuous conductive Rogowski coil structure in the flex circuit. This causes the magnetic field looping the shunt to flow between the two sets of traces when the coil is wrapped around the shunt. The section of traces labeled Mc are placed as near to the shunt as possible and opposite the return current path to form the cancelling mutual inductance. The Rogowski coil section is then wrapped, at least partially, around the shunt. In one embodiment, a transmission line such as 1148 connects to the coil. In another embodiment, the transmission line may connect to an isolation barrier, and in yet another embodiment, the isolation barrier exists in a probe head. The coil output may also connect to a fixed-time-constant single pole compensator 1146. FIG. 15 shows an embodiment of this comprises an RC filter, having a filter resistor $R_f$ and a filter capacitor $C_f$.

FIG. 16 shows a differential signaling embodiment. In a differential implementation, a shield portion of the isolation barrier, such as the shield of the isolated probe may tie to either side of the shunt. Half of the Rogowski coil 1151 may be placed on each side of the shunt in order to feed a differential signal through the compensation pole 1156. This may feed into $R_f/2$ on each side to $C_f$ from side to side of the differential probe input. Alternatively, $C_f$ may be replaced with two capacitors $2 \cdot C_f$ from each signal line to the reference. In another embodiment, the differential transmission line may be periodically "twisted" to cancel the pick-up of stray electro-magnetic fields.

Figure 17:
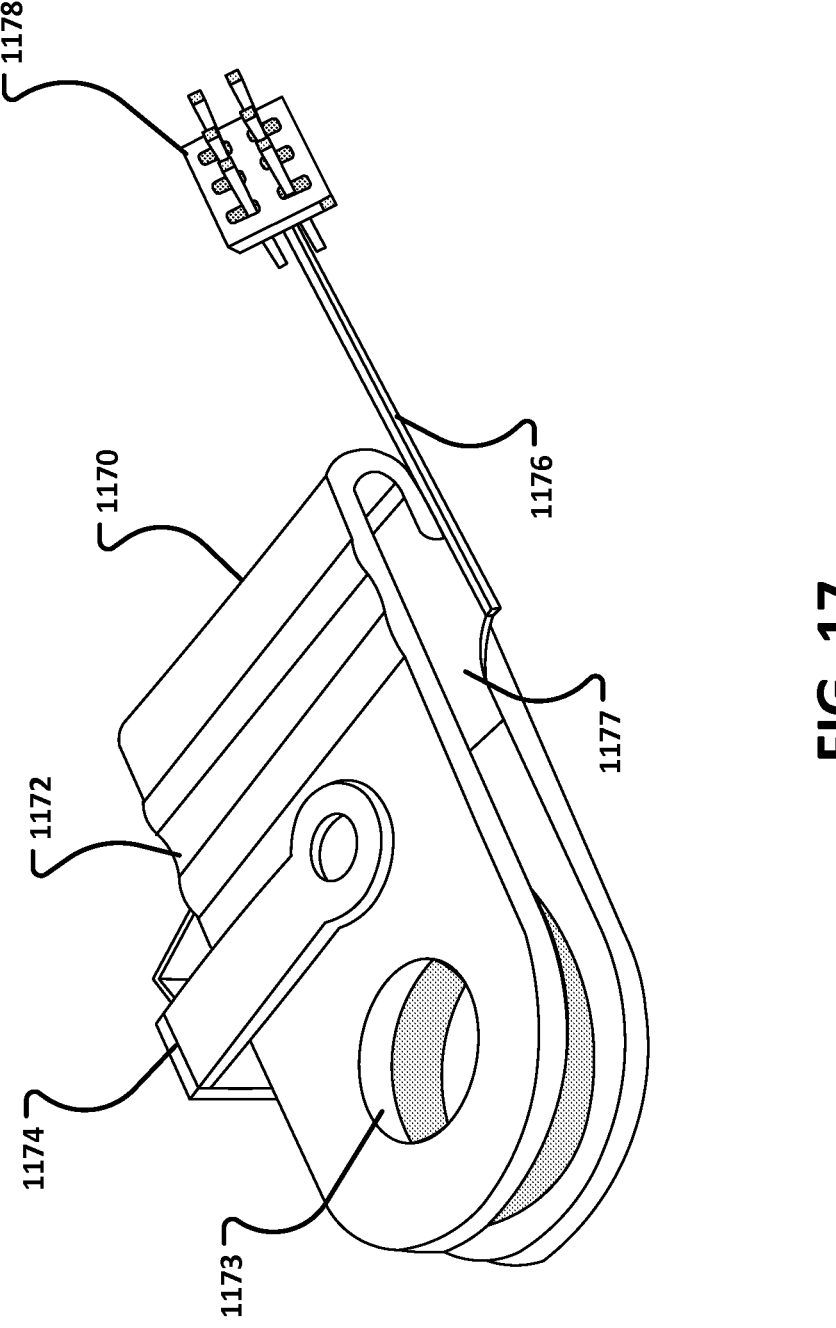
FIG. 17 shows an embodiment of a current shunt combined with a Rogowski coil for installation in a busbar.

FIG. 17 shows an embodiment of the shunt having the Rogowski coil in a busbar embodiment in which the Rogowski coil is sandwiched within a folded busbar shunt. The busbar shunt 1170 has a resistive portion 1172. The shunt folds in half to lower insertion inductance and put the two screw terminals such as 1173 on the same axis, with a flex circuit 1177 between the folded halves. One sense lead 1174 wraps around the top to connect to one side of the shunt and the other sense lead wraps around underneath, hidden in this view, to connect to the other side of the shunt. A square-pin connector 1178 at the end of a portion of the flex 1176 connects this to the isolation barrier or probe head. The traces on the flex for the coil, and the compensating pole components are not shown.

Figure 18:
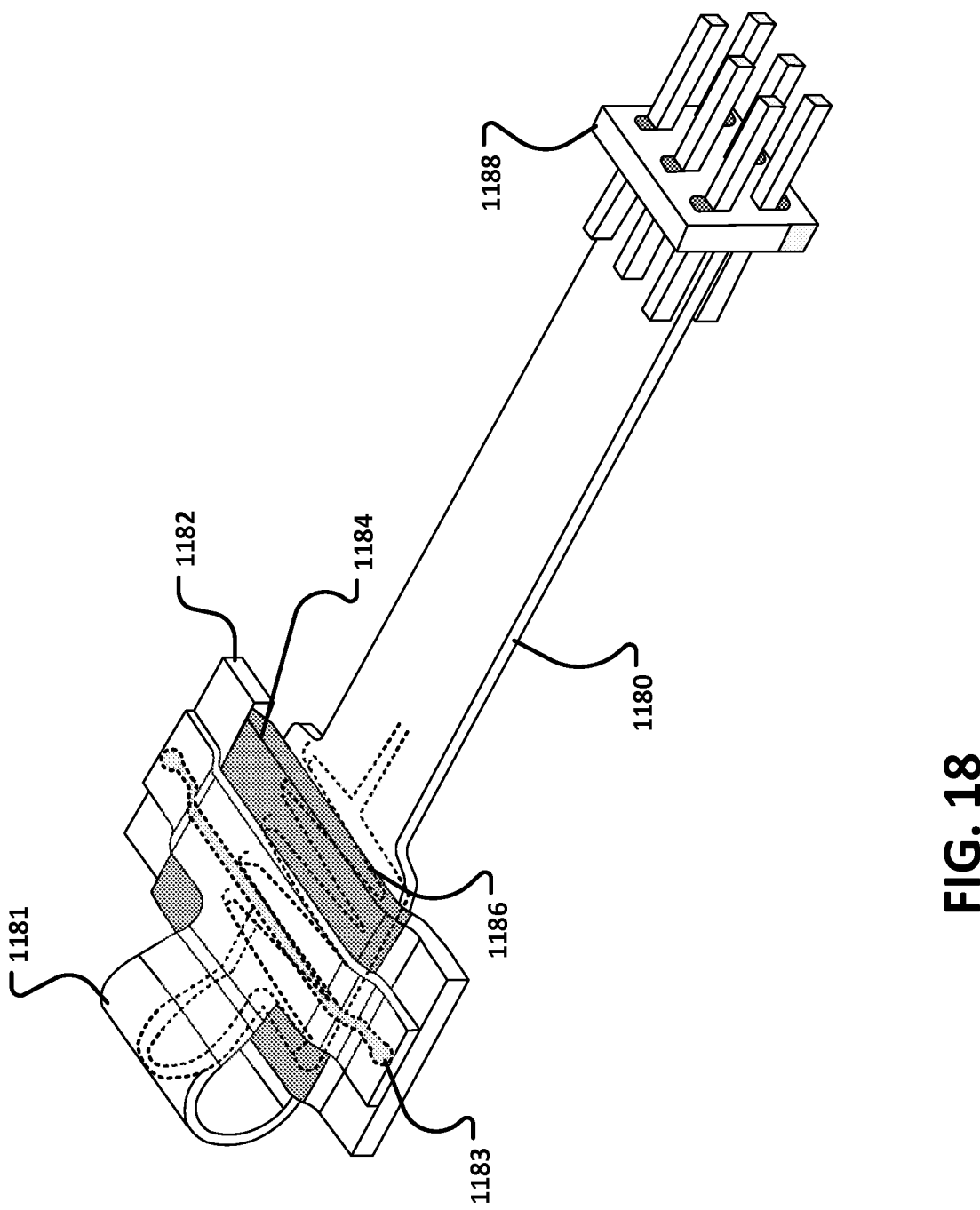
FIG. 18 shows an embodiment of a current shunt combined with a Rogowski coil for surface-mounting on a printed circuit board.

FIG. 18 shows an embodiment of a surface-mount shunt with a flex circuit 1180 underneath, between the shunt and the return path in the circuit board on which the shunt will be mounted. The shunt comprises the metal portion 1182 and the resistive portion 1184. Each sense lead such as 1183 wraps around the top of the shunt, by way of portion 1181 of flex circuit 1180, and connects on either side of the shunt to each metal portion such as 1182. In this picture, the flex circuit traces forming the Rogowski coil are shown at 1186. Although not shown, those traces would continue up the flex circuit 1180 to the compensating pole components and the square-pin connector 1188.

Many modifications and variations exist. For example, the filter resistor $R_f$ may serve as termination for a transmission-line between the shunt/coil and the filter, allowing the probe head to be placed some distance from the shunt while still maintaining high bandwidth. This allows the shunt to be placed in very close proximity to the load without providing extra room for the probe head, thus minimizing insertion inductance.

Since the Rogowski coil connects directly to the shunt around which it wraps, it does not need high-voltage insulation, and may be placed in very close proximity to the shunt. This may further reduce coil inductance by keeping the coil as short as possible.

If the return-current path is well-defined, such as for the surface-mount shunt over a return plane layer within a PCB, the Rogowski-coil self-inductance can be further minimized by shortening the coil to cover the space between the shunt and the return path only, rather than fully encircling the shunt. The magnetic field is strongest within the current loop, so this placement will achieve almost as much mutual inductance as a complete encirclement, but with considerably less self-inductance. This arrangement also avoids vias, used to implement the coils in a flex circuit, in the tight bend sections around the sides of the shunt, reducing the chance of via cracking.

The compensating filter time constant may be matched to the $M_R/R$ time constant with any combination of methods. For instance, in one embodiment, the shunt and the Rogowski coil may be built together as a single unit with appropriate component values. This may take the form shown in FIG. 17 or 18, as examples.

Another embodiment provides a selection of fixed-time-constant filters appropriate for given shunt-Rogowski-coil pairs. This may be implemented in the filter blocks 1146 and 1156 of FIGS. 15 and 16, respectively. In yet another embodiment, the filter block may provide one or more programmable filters, such as using FETs to switch capacitors in a capacitor DAC for $C_f$. The response pole due to the load of the filter resistance $R_f$ on the Rogowski coil's self-inductance may be compensated with a corresponding zero by placing some resistance in series with $C_f$. In yet another embodiment, the Rogowski loop area and/or pitch may be tapered along the length of the coil, such that the mutual inductance $M_R$ may be adjusted by sliding the appropriate section of the tapered coil underneath the shunt.

Regarding the system shown in FIG. 13, one can also work with the acquired signal from the probe as it enters the instrument to adjust for differences between the time constant of the compensating pole and $M_R/R$. For example, filter 1116, which is applied after the signal is acquired by the probe, may take form of a DSP pole-zero filter applied to the acquired waveform to cancel any remaining filter time constant mismatch. In addition, if the $M_R \cdot di/dt$ term does not sufficiently dominate the $R \cdot I$ term at the frequency where skin effect begins significantly changing the effective resistance R, the filter 1116 may comprise an analog and/or DSP filter applied to compensate the resultant error in the cross-over region between shunt- and Rogowski-dominated response.

Figure 19:
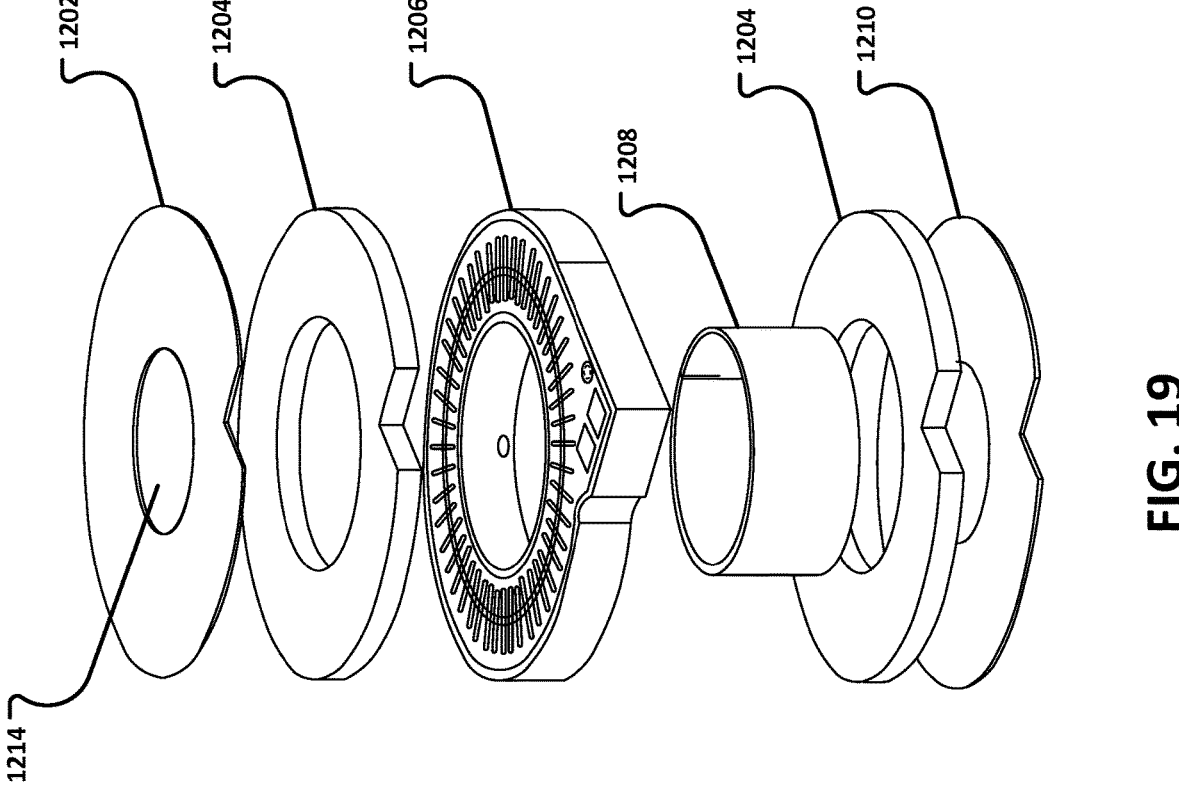
FIG. 19 shows an exploded view of an embodiment of a washer current shunt combined with a Rogowski coil.

FIG. 19 shows an embodiment of a washer current shunt 1200 similar to those set out above. The embodiments here include a Rogowski coil in the washer current shunt, where the coil surrounds the resistive portion. The structure has a top conductive contact layer 1202, one or more insulative layers 1204, the Rogowski coil 1206, a resistive core 1208, and a bottom conductive contact layer 1210. The current measurement device in this embodiment has a resistive core with an opening 1214 from the top surface of the core to the opposite surface (top to bottom as shown in the figure) through which a screw would be inserted. While many different manners of providing a Rogowski coil exist, as do other structures to contain it within the washer current shunt, one possible embodiment would be to manufacturing the Rogowski as a printed circuit board (PCB).

Similarly, to other embodiments of the Rogowski coil and shunt resistor discussed above, the signals from the Rogowski coil and the shunt resistor may be combined by a test and measurement device. The combination may include the coil being placed in series with the shunt resistor, or the two signals being combined by adding them together. The shunt resistor and the coil may be wired in a parallel fashion and the combination of their signals applied by the test and measurement device.

Figure 20:
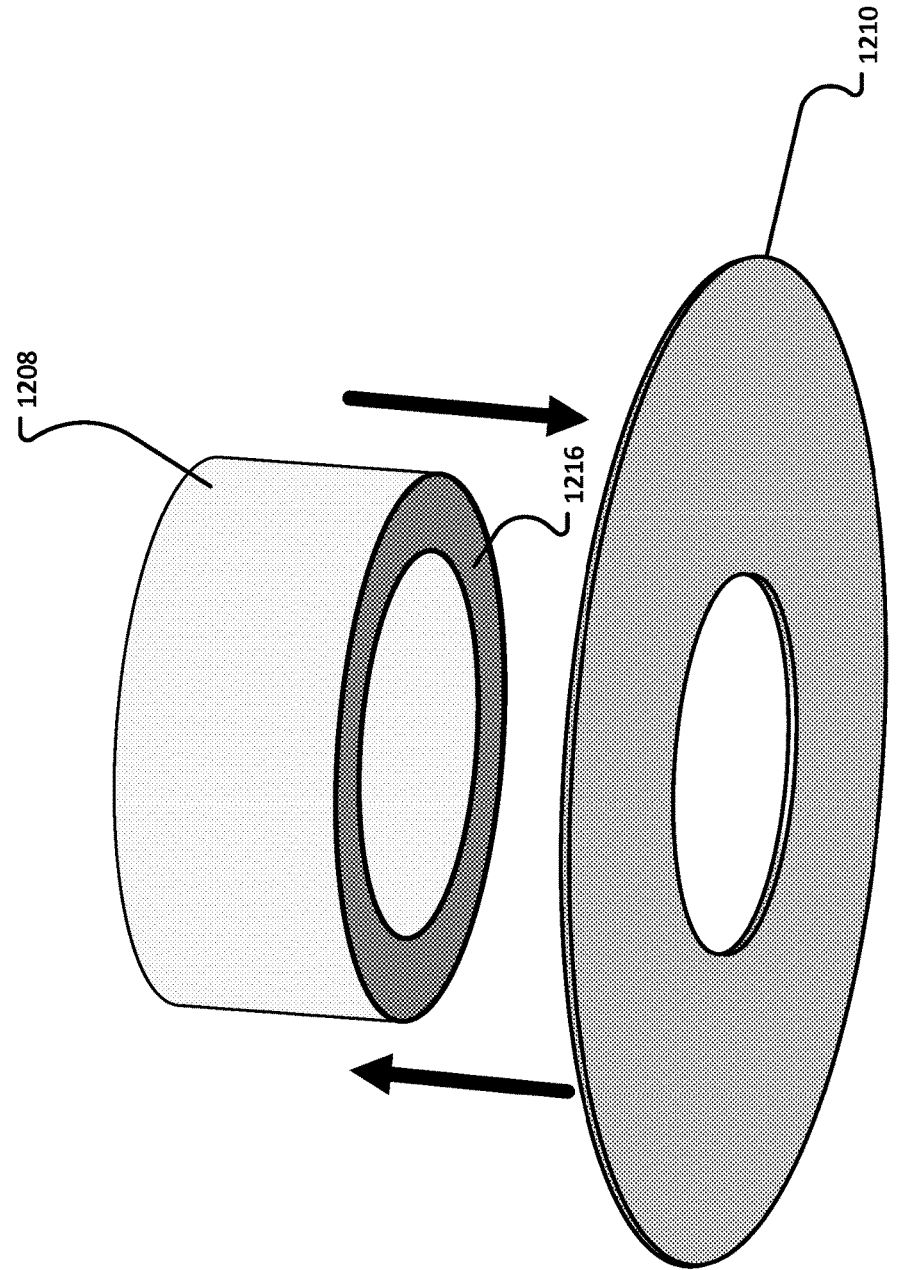
FIG. 20 shows a resistive portion and a contact plate for an embodiment of a washer current shunt combined with a Rogowski coil.

FIG. 20 shows a more detailed view of the resistive core and one of the conductive surfaces. As shown here, the resistor core 1208 has contact areas on the end surfaces of the core, 1216. The other end surface has the same contact area. The insulative layers surround the core, much like the coil structure, to the outside of the resistive core to allow the core to contact the conductive surfaces.

Figures 21, 22:
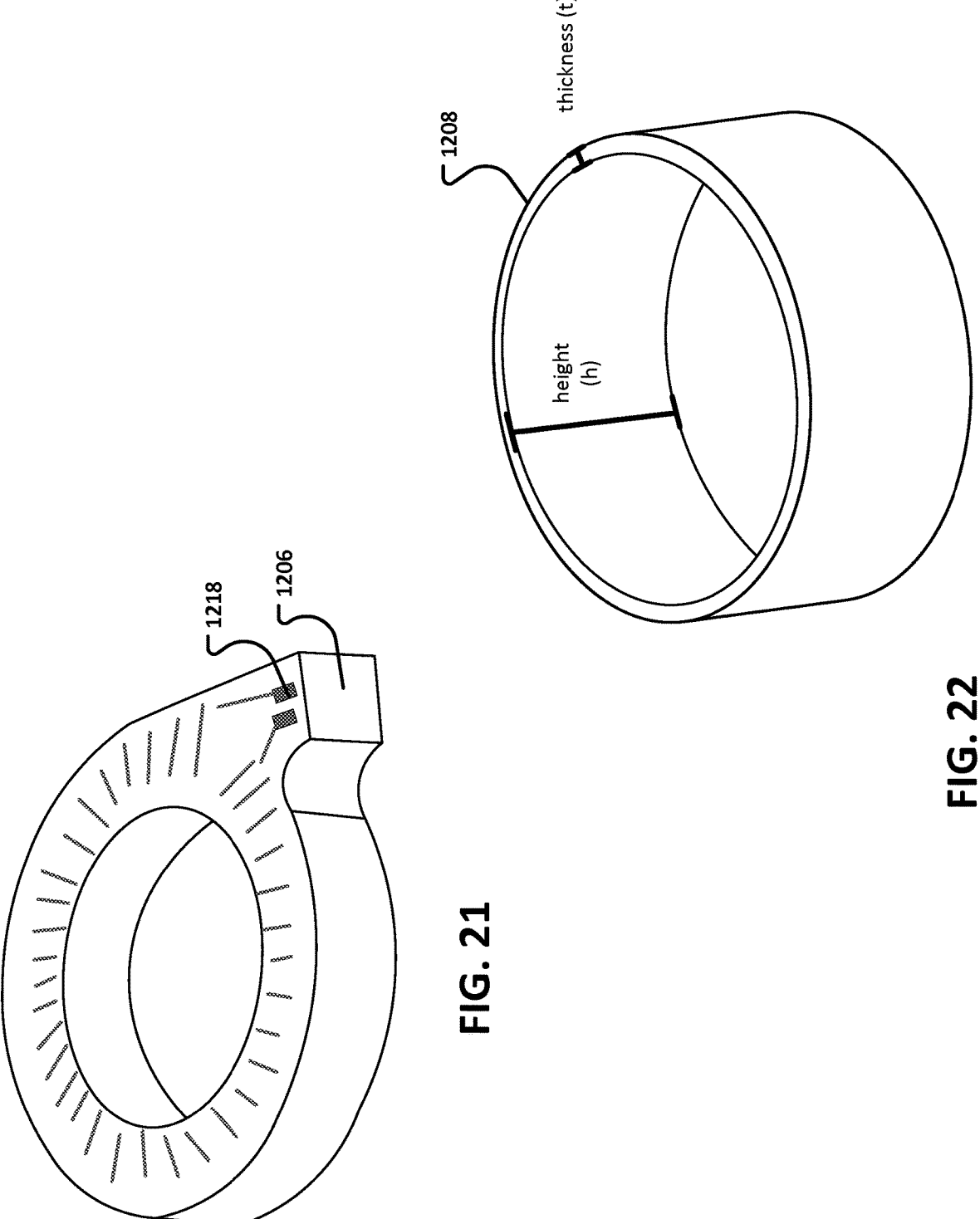
FIG. 21 shows an embodiment of a Rogowski coil.
FIG. 22 shows an embodiment of a resistive portion of an embodiment of a washer current shunt.

FIG. 21 shows a more detailed view of Rogowski coil 1206. In this view one can see the electrical contacts such as 1218. As will be shown in more detail below, these allow the connection between the resistive core on one contact and a measurement lead on the other, in a series configuration.

FIG. 22 shows a more detailed view of resistive core 1208. The resistive core has a height 'h' and a wall thickness 't.' The wall thickness determines the electrical skin depth of the coil. The electrical skin depth determines the frequency at which the current measurement device will enter the mode in which the Rogowski coil becomes active. As discussed above, the shunt resistor is active from DC through a lower frequency. As the frequency of the signals increase, the Rogowski coil becomes active. The selection of the wall thickness determines the effective measurement bandwidth.

Figure 23:
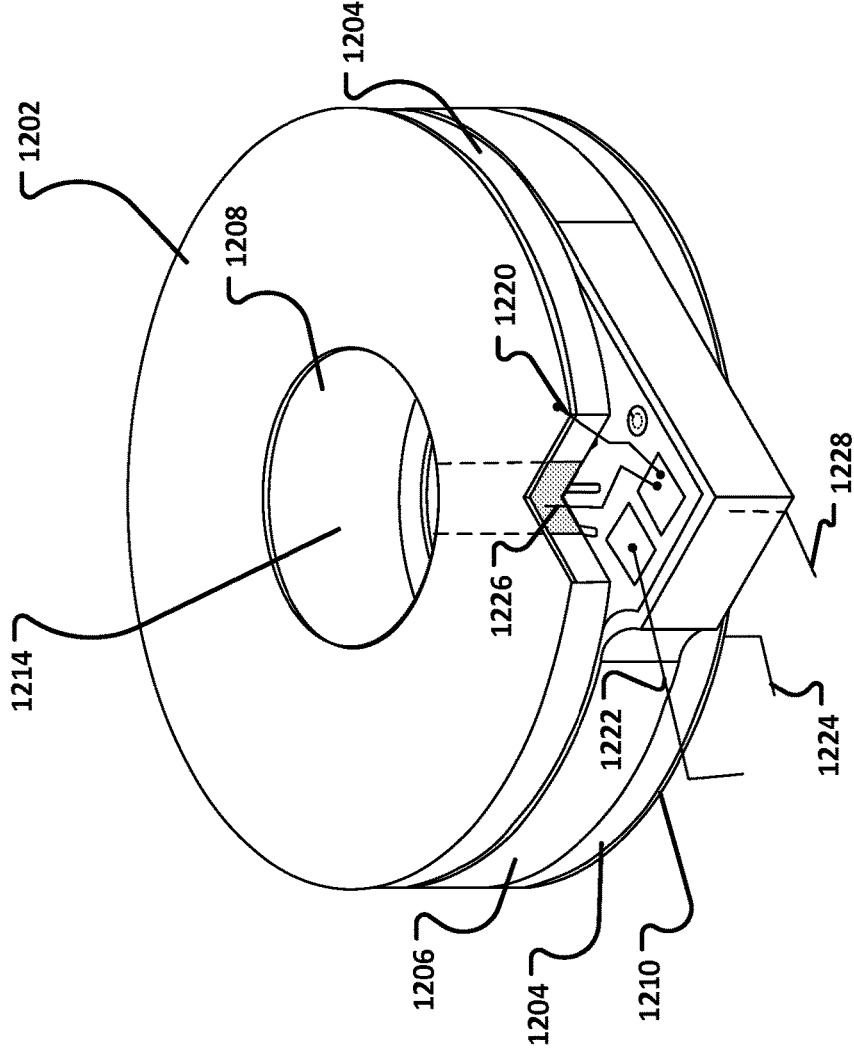
FIG. 23 shows an embodiment of an assembled Rogowski coil with embodiments of measurement leads.

FIG. 23 shows the assembled current measurement device having the conductive layers 1202 and 1210 in contact with the resistive core 1208. The Rogowski coil structure 1206 is separated from the conductive layers by one or more insulators 1204, and the entire assembly has a center opening 1214 to allow a screw or other fastener to be inserted.

The contacts on the Rogowski coil can electrically connect to the resistive core to place it in series in different ways. In a first embodiment, one of the electrical contacts on the coil structure is connected by a sense lead wire 1220 to one of the conductive layers. One example shown in FIG. 23 uses the top conductive surface. The other electrical contact has a measurement lead 1222. The other measurement lead 1224 electrically connects to the other conductive surface of the structure.

Alternatively, the insulative layers may have gaps or slots. In one embodiment, the insulative layers have the shape of a letter 'C.' This allows the connection to the Rogowski coil electrical contact of measurement lead 1226 to come directly from the top surface of the resistive core. The measurement lead 1222 would be the same, and the other measurement lead 1228 would directly contact the resistive core and exit through a slot or gap in the lower insulative layer, now shown.

In this manner, one can provide a washer current shunt having a shunt resistor and a Rogowski coil in a form factor that allows for insertion of a fastener.

Figure 24:
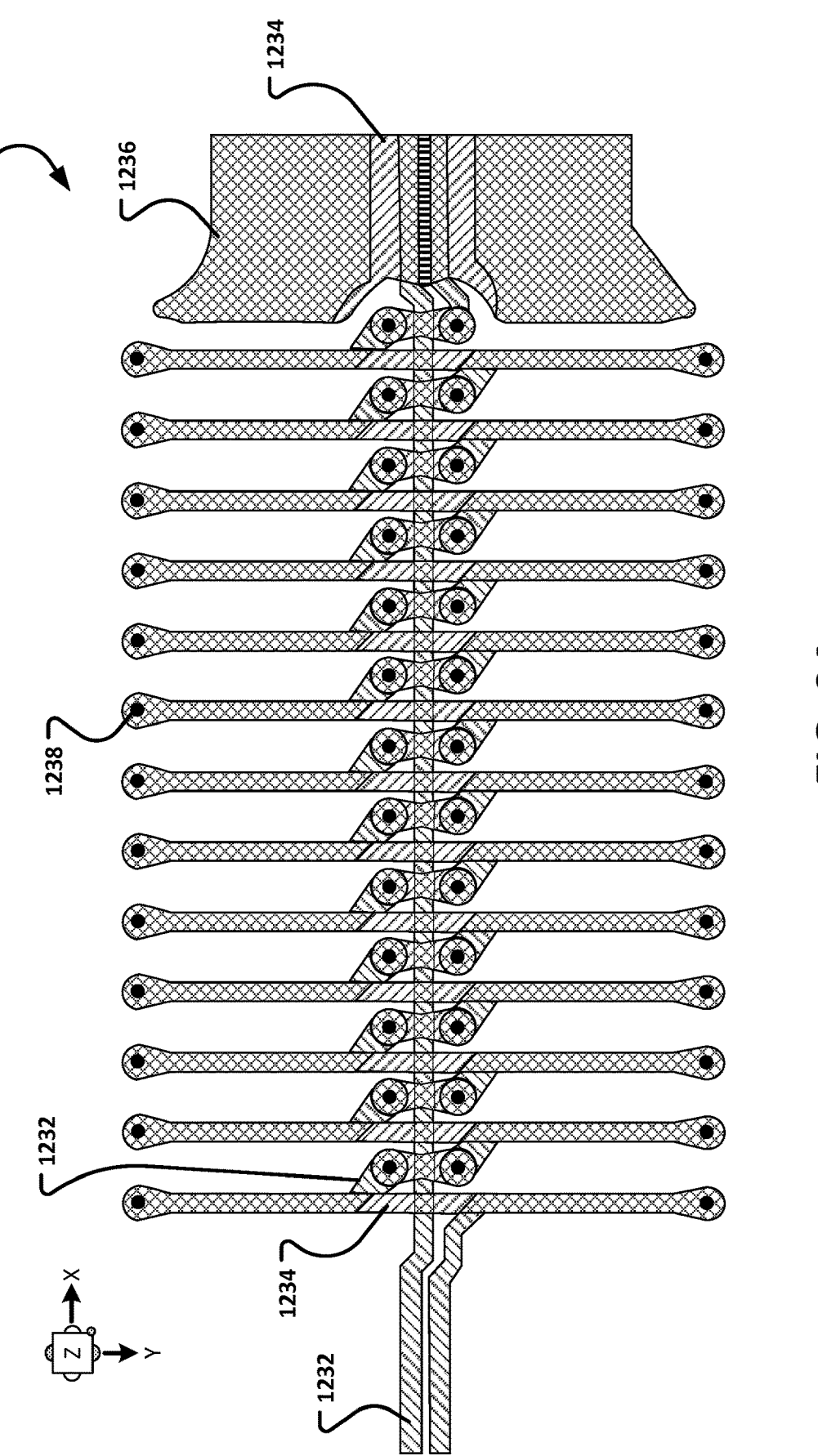
FIGS. 24-25 show single-ended embodiments of a Rogowski coil on a flexible substrate.

In another embodiment, the coil resides in a flexible circuit substrate as discussed above, but in a multilayered embodiment that may provide improved cancellation of magnetic fields. FIG. 24 shows a flexible substrate 1230 that has multiple layers. A first layer 1232 shown in one set of single hash marks has a first set of coil traces and contact points such as 1238 that define vias between the various layers. A second layer 1234 having single hashmarks in an opposite direction has a second set of coil traces and contact points for the other 'end' of the vias. The first and second coil traces are configured such that one set partially overlays the other set in a first dimension. The coil structure connects to the shunt resistor in any of ways discussed above.

As can be seen in the upper right corner, as oriented here, the x-direction or dimension is across the page left to right or right to left, the y-direction or dimension runs from the top of the page to the bottom or the bottom to the top, and the z-direction or dimension comes in and out of the page. The view of the substrate is a top view looking down into the page. In the examples here, this is the dimension in which the first and second coil traces at least partially overlap. The regions such as 1236 where the overlap occurs are cross-hatched.

The two sets of coil traces form the Rogowski coil. The vias such as 1238 between the first layer and the second layer, the first series of coil traces and first contact points and the second series of coil traces and second contact points forming a Rogowski coil and one of the first contact points and the second contact points are connected to the shunt resistor. In the embodiment of FIG. 24, the Rogowski coil has a single-ended output signal. This substrate connects to the Rogowski coil as shown in the earlier embodiments discussed above and has similarly configured sense leads.

The embodiments in FIGS. 24-28 have an advantage in that there is no current loop area in the dimensions perpendicular to the coil structure. This provides better cancellation and therefore more accurate measurements.

Figure 25:
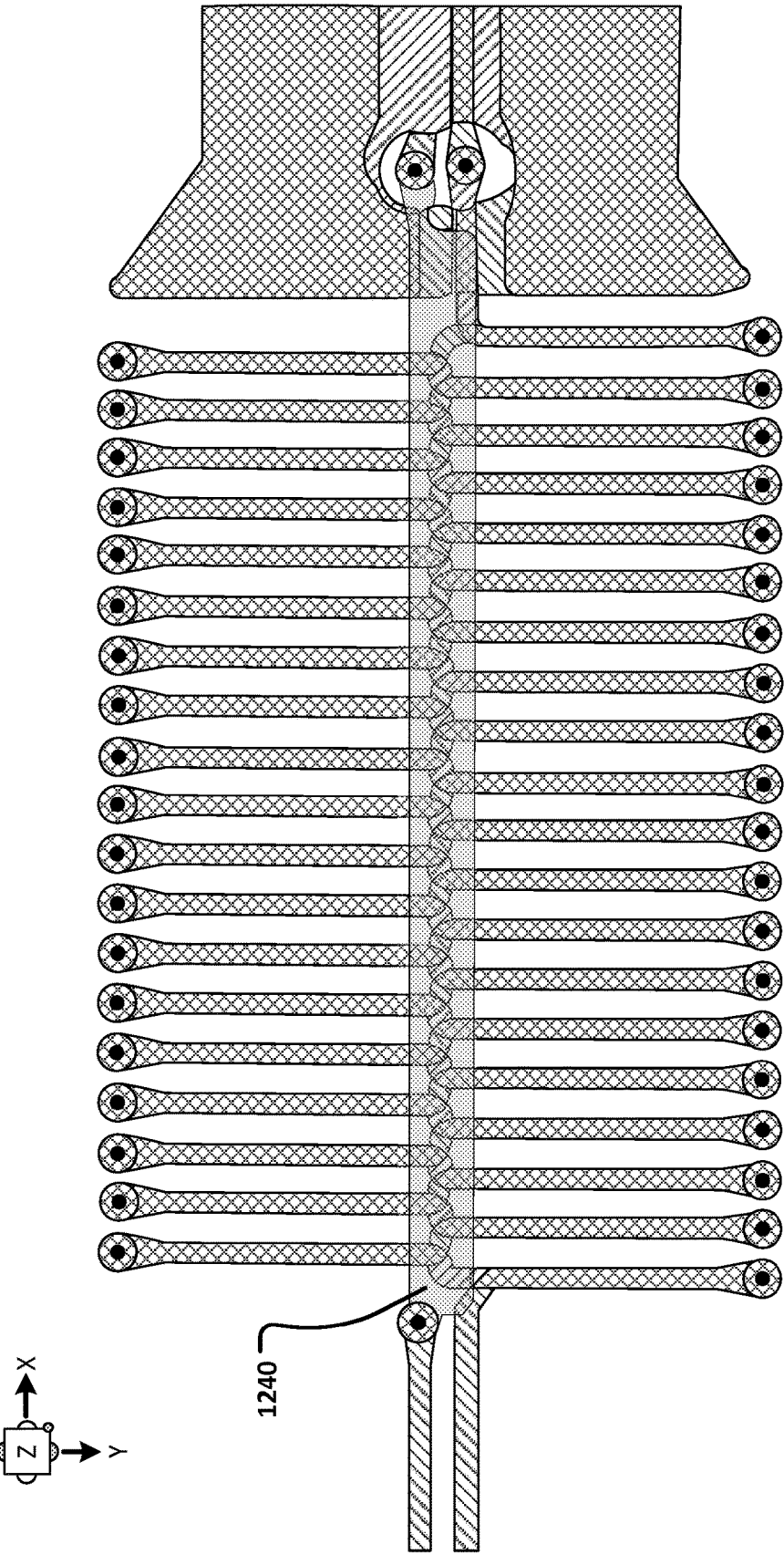

FIG. 25 shows an embodiment of a third layer 1240 represented by the center trace. The third layer provides mechanical stability to the structure. This prevents the coil structure from collapsing and keeps the two other layers in a mostly planar orientation. In addition, the trace on the third layer, lying in the center of the coil acts as a return current path. The center trace may be wider than the other traces to afford that mechanical stability.

Figure 26:
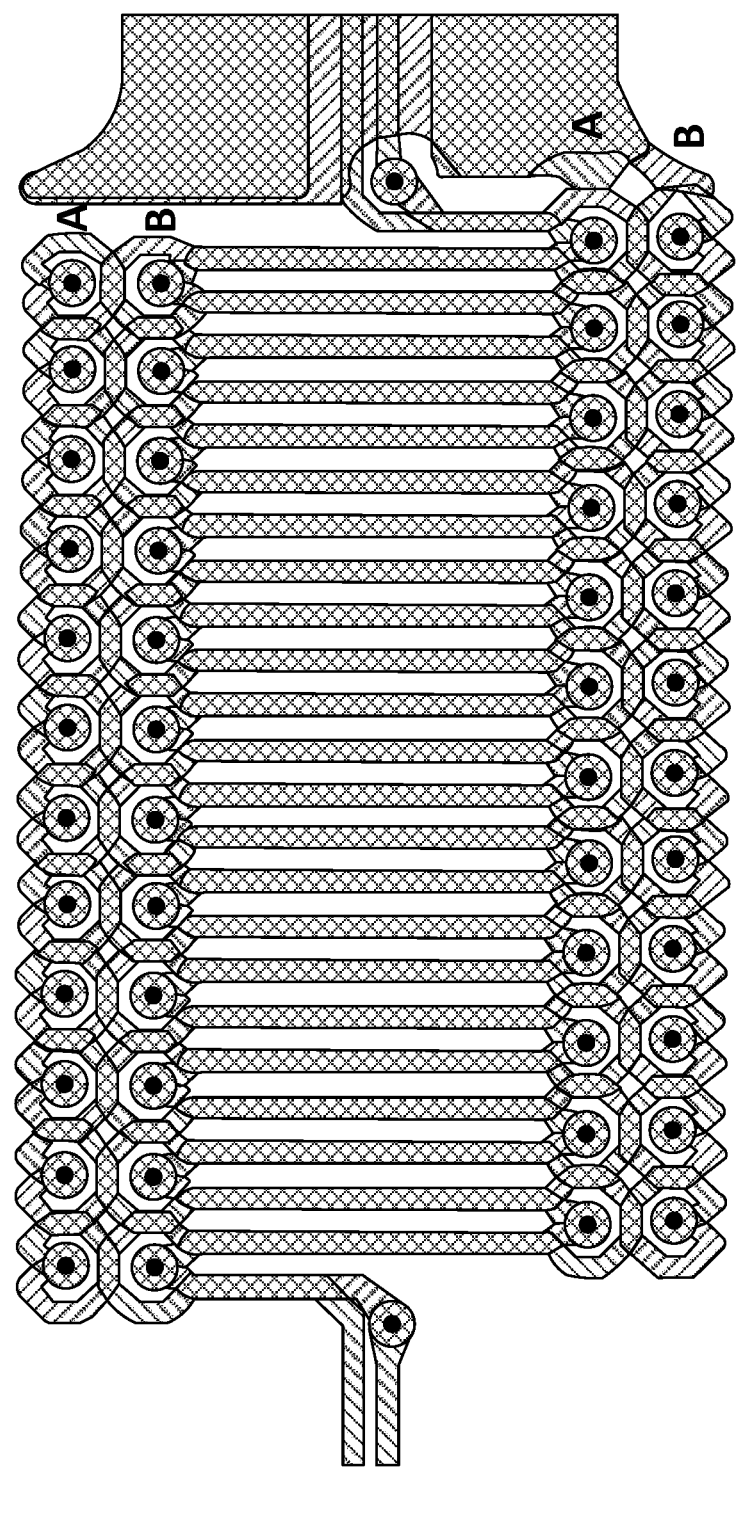
FIGS. 26-28 show differential embodiments of a Rogowski coil on a flexible substrate.
Figure 27:
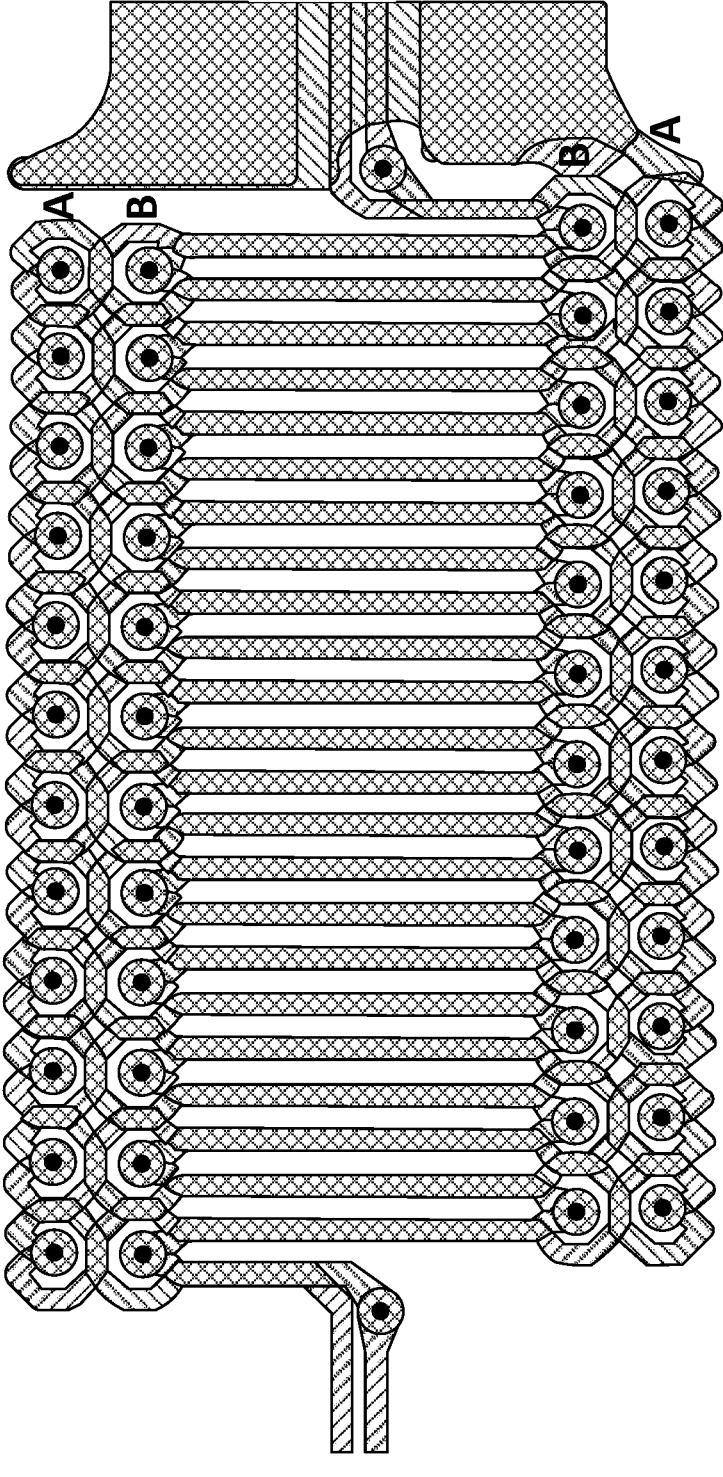
Figure 27:
Figure 27:
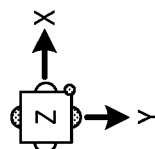
Figure 28:
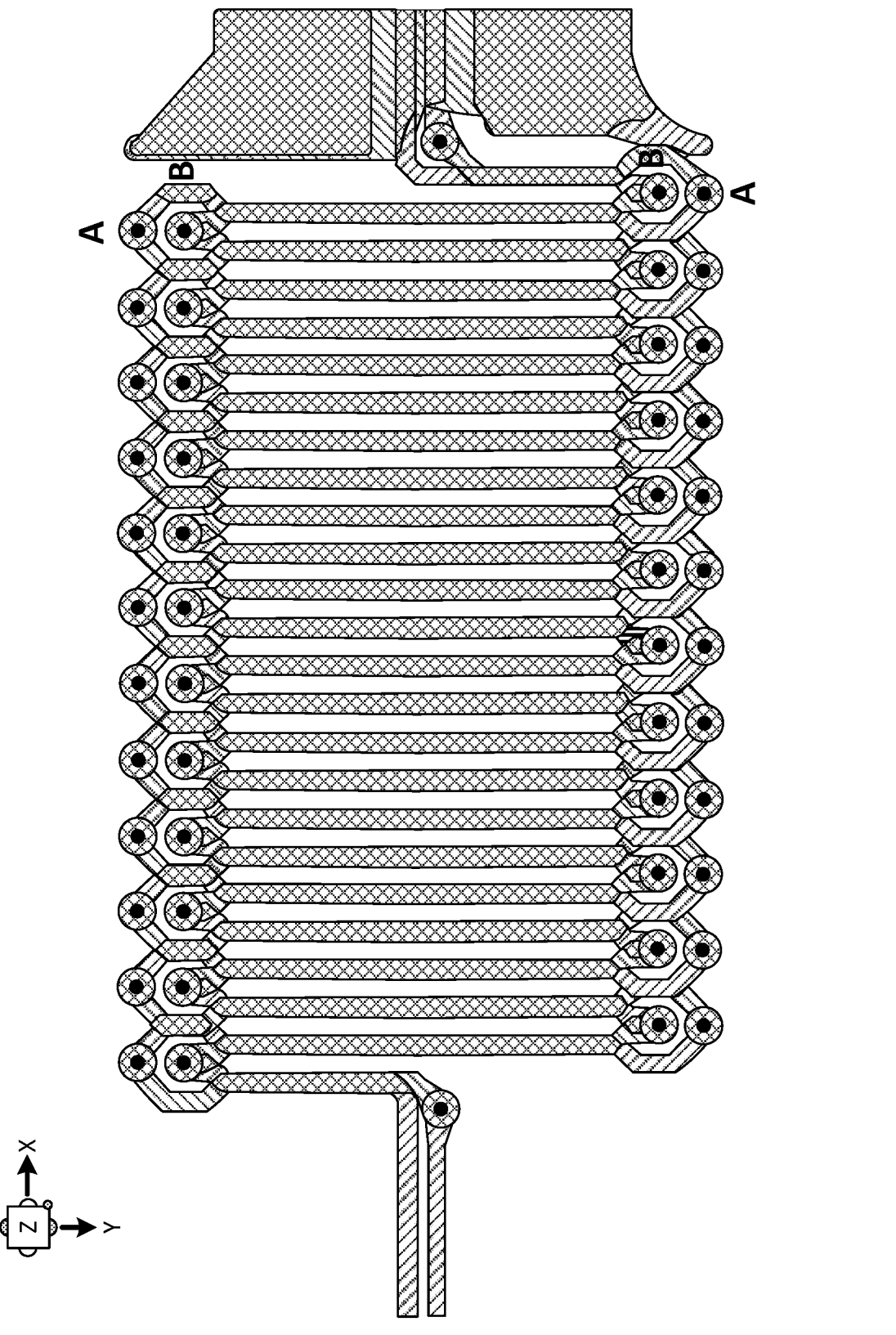

FIGS. 26-28 show embodiments where the Rogowski coil has a differential output signal. The relationship between the two coils as they overlap can define the manner in which the coil operates. The coils are defined by the vias from top to bottom in the figures. In the embodiment of FIG. 26, the vias define an A coil and a B coil, where the coils have an A-B-A-B pattern as viewed looking down into the page along the z-direction. Each coil structure is slightly offset from the other in the x-direction. The traces form opposing loops around the outside of the coils, which serves to locally cancel fields in the z-direction.

In FIG. 27, the vias from top to bottom are associated with the coils in an A-B-B-A pattern. This results in a coil structure that is centered in the x-direction but has different dimensions in the y-direction. The traces form opposing loops around the outside of the coils to locally cancel field in the z-direction.

FIG. 28 shows a coil structure in which the coils again have an A-B-B-A structure, centered in the x-direction, but different in the y-direction. While the wrapping traces around the outsides of the coils serve to cancel fields in the z-direction, each loop at one extreme of the coil in the y-direction has its complement at the other extreme. This cancels fields across a greater distance than the local canceling embodiments above.

Figure 29:
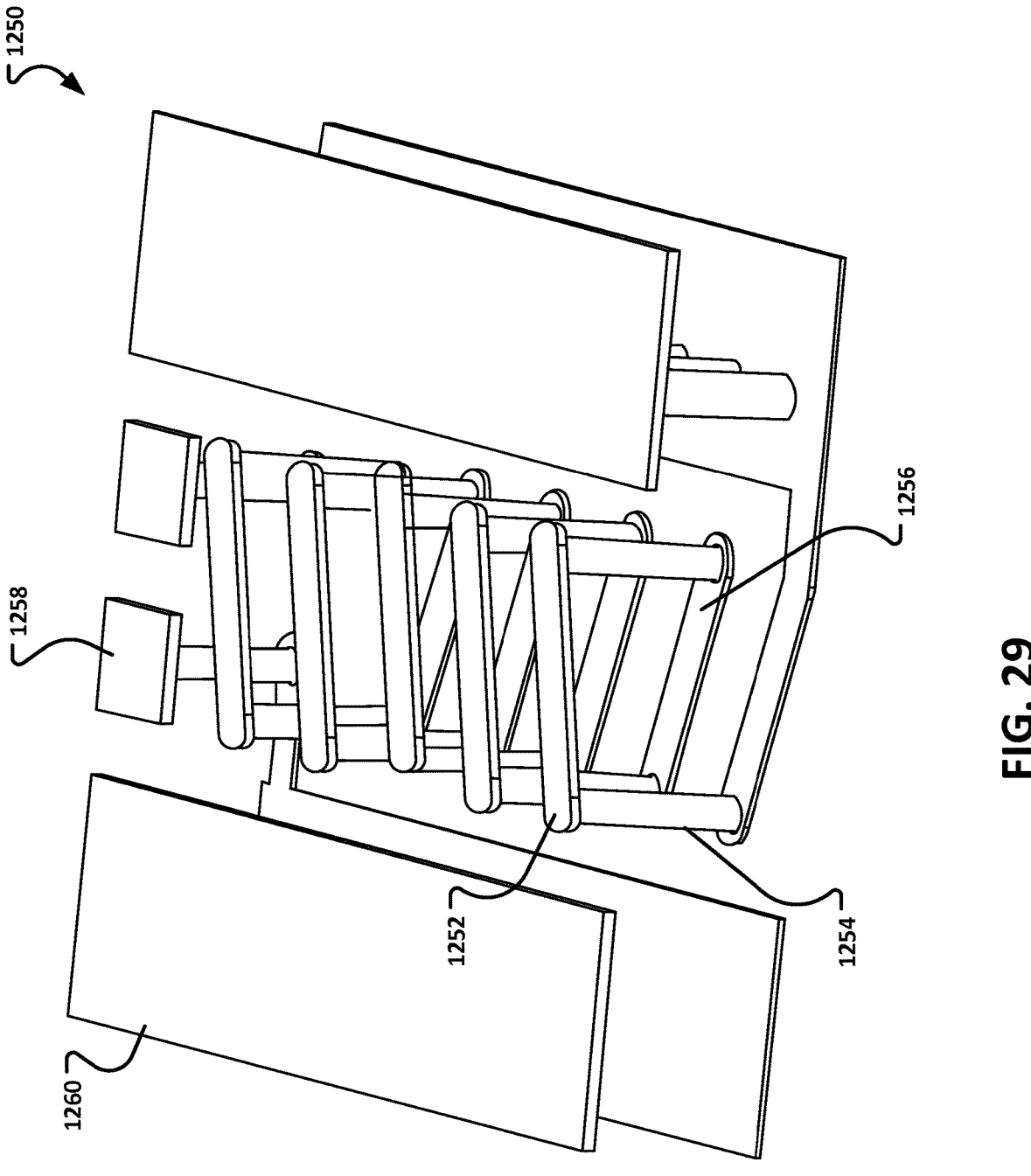
FIG. 29 shows an embodiment of a Rogowski coil for a rigid substrate.

FIG. 29 shows an embodiment of a coil structure 1250 implemented into a rigid substrate, such as ceramic or glass. This type of substrate may have advantages for surface mount technology (SMT), as well as being able manufacture the coil structures at the wafer level using thin and thick film processes. They would then undergo dicing to produce the individual current measurement devices. FIG. 29 shows a detailed view of the conductive structures without the substrate.

The coil structure has metal traces such as 1252 on a first surface of the rigid substrate. Vias such as 1254 connect those traces with traces on the bottom surface such as 1256.

This forms the coil structure. Contact pads such as 1258 and 1260 allow for connection to the measurement leads. As will be discussed below, the shunt resistor will generally mount to the top surface. One should note that the references to top and bottom are relative to an individual orientation shown in the figures. While not shown in FIG. 29, a center trace through the middle of the coil structure may be included to provide a return path, similar to 1240 in FIG. 25.

Figure 30:
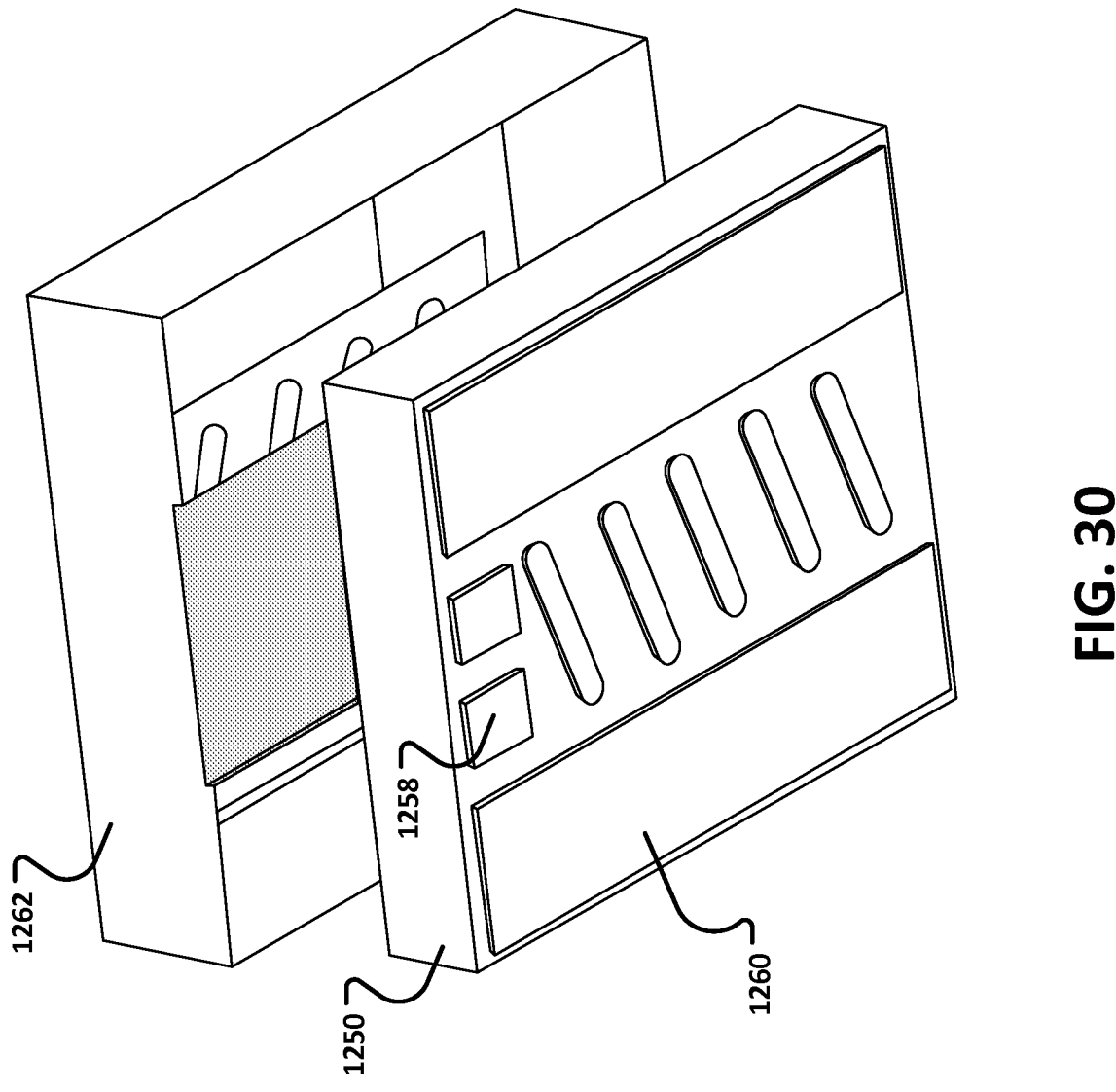
FIGS. 30-31 show surface mount embodiments of a Rogowski coil in a rigid substrate.

In one embodiment, a discrete SMT resistor is laminated or otherwise mounted on top of the coil substrate by soldering, pasting, etc., to the exposed pads. In any embodiments, the resistor may be mounted above a center axis of the coil structure to provide a return path. A thin film resistive material or solder mask keeps the coil from shorting to the resistor. IN FIG. 30, the resistor 1262 is shown in the upper part of the image, and the Rogowski coil structure 1250 with its substrate in the lower part of the image. One can see the traces on the surface of the substrate the form part of the coil and the contact pads 1258 and 1260 and their counterparts that provide for Kelvin sensing.

Figure 31:
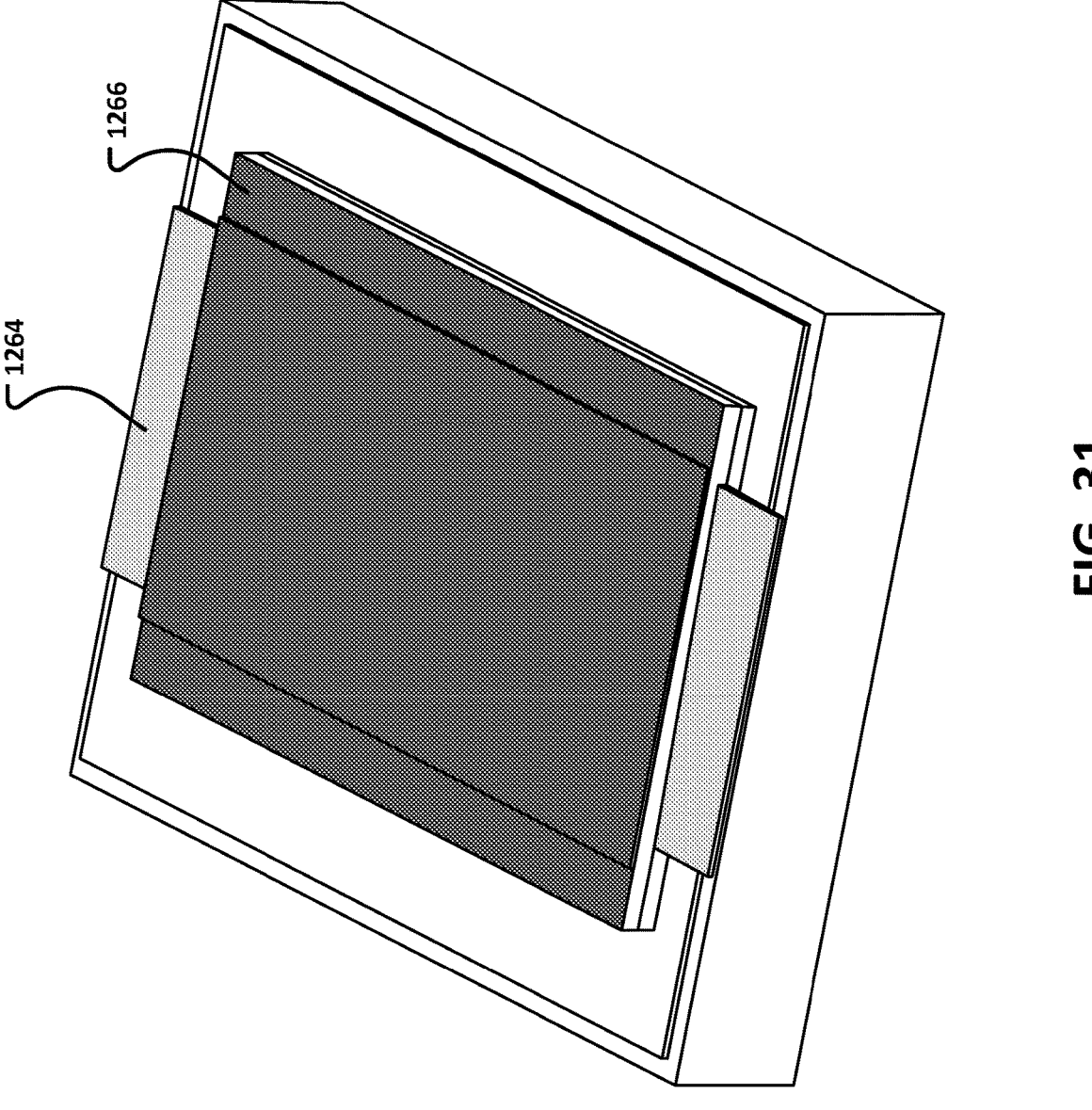

Alternatively, the thin film processes that form the coil could be adapted to include the shunt resistor. As shown in FIG. 31, after formation of the coil in the substrate, an insulative layer 1264 could be deposited on the coil structure. The resistive layer 1266 would then be deposited over the insulator to overlap to connect to the conductive surfaces. This process is well-suited for the thin and thick film processes at the wafer level.

Figure 32:
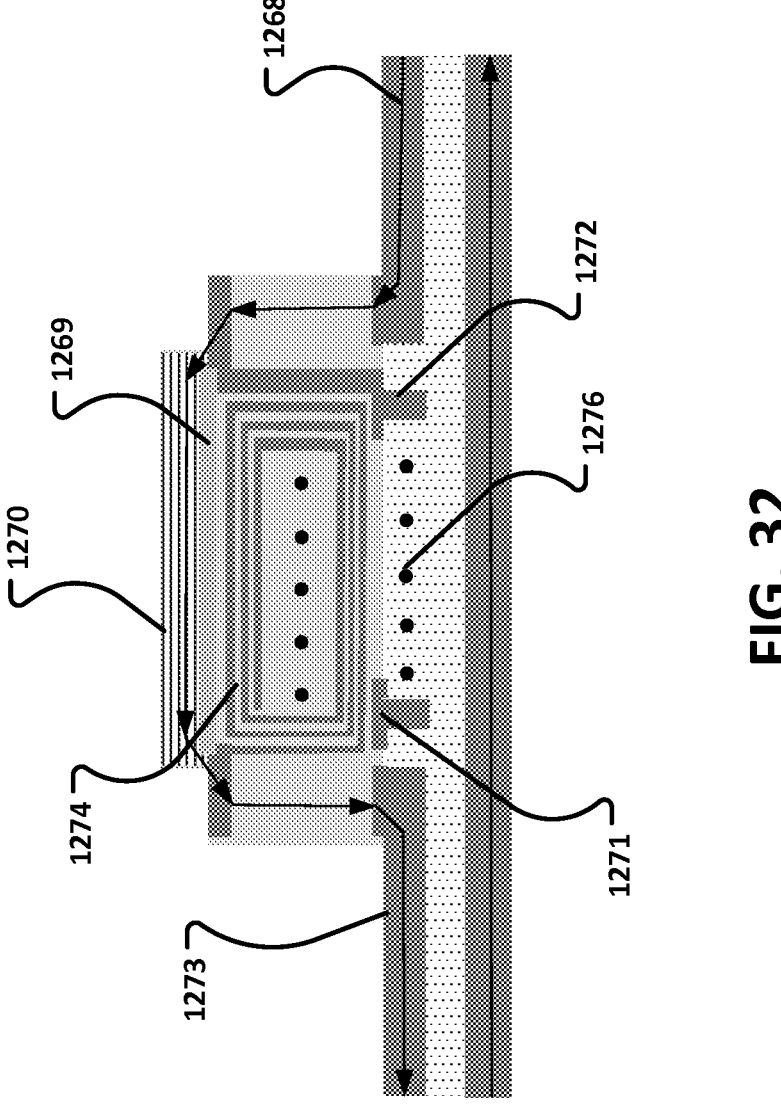
FIG. 32 shows a current and field diagram for an embodiment of current monitor in a rigid substrate.

FIG. 32 shows a current and field diagram for a current monitor comprising a shunt resistor and a Rogowski coil in a rigid substrate. The arrows such as 1268 show the current flow, where the darker shading such as 1273 represents conductive material, including the coil structure 1274. The measurement contacts are shown at 1271 and 1272. The resist 1270 lies on the insulator 1269. The magnetic field lines are shown by the black dots such as 1276. The field lines represented by the black dots could be anywhere inside the current loop designated by the arrows.

Figure 33:
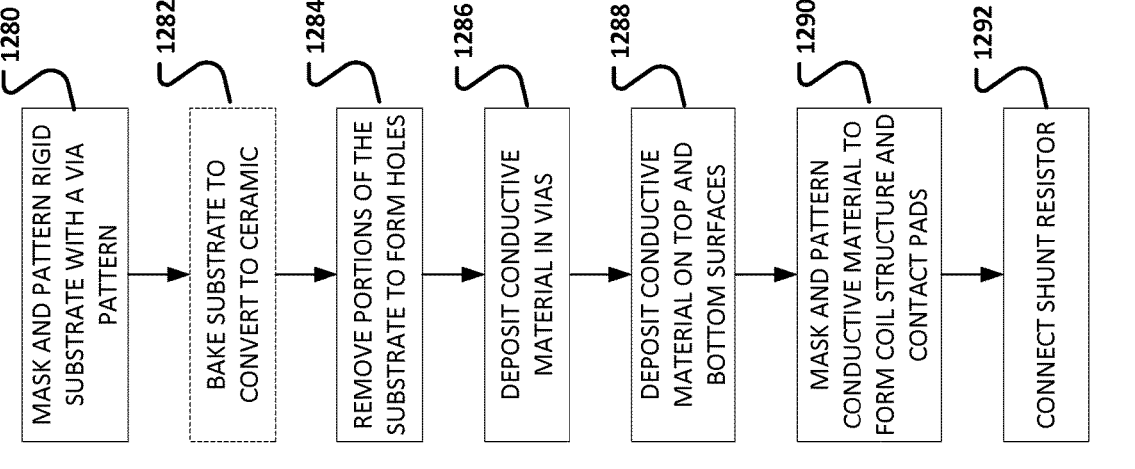
FIG. 33 shows a process flow for manufacture of a Rogowski coil in a rigid substrate.

FIG. 33 shows a method of manufacturing a Rogowski coil in a rigid substrate. The substrate undergoes masking and patterning at 1280 with the via pattern. Typically, the mask covers the portions of the substrate that are to be retained and the portions that are exposed are to be removed, although the reverse may be true. If the substrate is glass, the substrate is baked to convert the exposed regions to ceramic at 1282. If the substrate is ceramic, this step is not needed. The portions of the substrate defined by the masking and patterning step are then removed to form the vias as 1274. Conductive material is then deposited into the vias, such as by plating at 1286. A thicker metal layer is then deposited onto both top and bottom surfaces of the substrate at 1288. This is then masked, patterned, and processed at 1290, such as by etching, to form the coil traces that connect the vias and the contact pads and other conductive portions. The shunt resistor is connected at 1292, either by lamination and soldering/pasting, or by deposition of the insulator and the resistive layer, as discussed above.

EXAMPLES

Illustrative examples of the disclosed technologies are provided below. An embodiment of the technologies may include one or more, and any combination of, the examples described below.

Example 1 is a current measurement device, comprising: a shunt resistor having measurement leads, the shunt resistor comprising a resistive core having an opening, the shunt resistor configured to be located in a current path of a current to be measured; a Rogowski coil surrounding the resistive core, the Rogowski coil having electrical contacts; a conductive layer on a first side of the resistive core, and a conductive layer on a second side of the resistive core opposite the first side; and one or more insulative layers between each of the conductive layers and the Rogowski coil, the current measurement device configured to combine signals from the shunt resistor and the Rogowski coil.

Example 2 is the current measurement device of Example 1, wherein the current measurement device is configured to combine the signals by one of placing the Rogowski coil in series with the resistive core or adding the signals.

Example 3 is the current measurement device of either of Examples 1 or 2, wherein the resistive core is electrically connected to one of the Rogowski coil electrical contacts and another of the Rogowski coil electrical contacts is electrically connected to a first of the measurement leads.

Example 4 is the current measurement device of Example 3, wherein the resistive core is electrically connected to one of the Rogowski coil electrical contacts through the conductive layer on the first side of the resistive core.

Example 5 is the current measurement device of Example 3, wherein the resistive core is directly electrically connected to one of the Rogowski coil electrical contacts through a gap in the one or more insulative layers.

Example 6 is the current measurement device of any of Examples 1 through 5, wherein one of the measurement leads is one of either electrically connected to the resistive core through the conductive layer on the second side of the resistive core, or directly electrically connected to the resistive core through a gap in the one or more insulative layers.

Example 7 is the current measurement device of any of Examples 1 through 6, wherein the resistive core has a wall thickness selected to set a frequency at which the Rogowski coil becomes active.

Example 8 is the current measurement device of any of Examples 1 through 7, wherein the Rogowski coil comprises a coil in a printed circuit board.

Example 9 is a current measurement device, comprising: a shunt resistor having sense leads, the shunt configured to be located in a current path for a current to be measured; and a Rogowski coil on a flexible substrate at least partially wrapped around the shunt, the current measuring device configured to combine signals from the shunt resistor and the Rogowski coil.

Example 10 is the current measurement device of Example 9, wherein the Rogowski coil is configured so that no loop area exists in a dimension perpendicular to the Rogowski coil.

Example 11 is the current measurement device of either of Examples 9 or 10, wherein the Rogowski coil comprises: a first layer of the flexible substrate containing a first series of coil traces and first contact points; a second layer of the flexible substrate containing a second series of coil traces and second contact points at least partially overlaying the first series of coil traces and first contact points in a z-direction; and vias between the first layer and the second layer, the first series of coil traces and first contact points and the second series of coil traces and second contact points forming a Rogowski coil and one of the first contact points and the second contact points are connected to the shunt resistor.

Example 12 is the current measurement device of Example 12, further comprising a third layer between the first and second layers.

Example 13 is the current measurement device of Example 12, wherein the third layer contains a trace in a center of the Rogowski coil to act as a return path.

Example 14 is the current measurement device of Example 12, wherein the third layer is configured to provide mechanical stability to the flexible substrate, including being wider than other traces in the flexible substrate.

Example 15 is the current measurement device of any of Examples 9 through 14, wherein the current measurement device is configured to produce a single-ended output signal.

Example 16 is the current measurement device of any of Examples 9 through 15, wherein the current measurement device is configured to produce a differential output signal.

Example 17 is the current measurement device of Example 16, wherein the first series of coil traces overlay the second series of coil traces so that the first contact points and the second contact points form an alternating A-B-A-B pattern in a y-direction dimension to locally cancel fields in the first dimension.

Example 18 is the current measurement device of Example 16, wherein the first series of coil traces overlay the second series of coil traces so that the first contact points and the second contact points form an A-B-B-A pattern centered in an x-direction and vary in a y-direction to locally cancel fields in the first dimension.

Example 19 is the current measurement device of Example 16, wherein the first series of coil traces overlay the second series of coil traces so that the first contact points and the second contact points form an A-B-B-A pattern centered in an x-direction and have opposing loops at extremes of the y-direction to cancel fields at a larger distance than locally canceling coils.

Example 20 is a current measurement device, comprising: a rigid substrate having a top surface and a bottom surface; vias through the rigid substrate from the top surface to the bottom surface, the vias filled with a conductive material; conductive layers on the top surface and the bottom surface connecting to the vias to form a Rogowski coil structure; one or more insulative layers directly on the coil structure; a shunt resistor directly on the one or more insulative layers; and measurement contacts on the bottom surface.

Example 21 is the current measurement device of Example 20, wherein the rigid substrate is one of glass or ceramic.

Example 22 is the current measurement device of either of Examples 20 or 21, wherein at least one insulative layer of the one or more insulative layers resides on the top surface of the rigid substrate, the top surface having exposed contact pads electrically connected to the coil structure, and the shunt resistor resides on the insulative layer on the top surface of the rigid substrate and is electrically connected to the exposed pads.

Example 23 is the current measurement device of any of Examples 20 through 22, wherein the shunt resistor is centered above a center axis of the coil structure.

Example 24 is the current measurement device of any of Examples 20 through 23, wherein the device further comprises a conductive trace through a middle of the coil structure to provide a return path.

Example 25 is the current measurement device of any of Examples 20 through 24, wherein at least one insulative layer of the one more insulative layers resides on a top surface of the rigid substrate and the shunt resistor comprises a layer of resistive material laying on the at least one insulative layer and in contact with the conductive layer on the top surface.

Example 26 is a method of manufacturing a current measurement device, comprising: masking a rigid substrate with a via pattern; removing portions of the substrate to form holes through the substrate; depositing conductive material to form conductive vias in the holes; and depositing a second layer of conductive material on a top surface and a bottom surface of the substrate to connect the vias to form a coil pattern, and measurement contacts on one surface of the rigid substrate; masking and patterning the second layer of conductive material on the top surface and the bottom surface to connect the vias to form a Rogowski coil structure, and contact pads on the top surface; and connecting a shunt resistor to the Rogowski coil structure.

Example 27 is the method of manufacturing of Example 26, wherein the rigid substrate comprises glass, and masking the rigid substrate with a via pattern comprises baking the rigid substrate to convert exposed regions into ceramic before removing portions of the substrate.

Example 28 is the method of manufacturing of either of Examples 26 or 27, wherein connecting a shunt resistor comprises attached a surface mount resistor to the contact pads.

Example 29 is the method of manufacturing of any of Examples 26 through 28, wherein connecting a shunt resistor comprises depositing one or more insulative layers over the coil structure and depositing a resistive material on the one or more insulative layer.

Example 30 is the method of manufacturing of any of Examples 26 through 29, further comprising passivating the second layer of conductive material on the top surface and the bottom surface prior to connecting the shunt resistor.

Example 31 is the method of manufacturing of Examples 26 through 30, wherein a plurality of the current measurement devices is manufactured at a wafer level and then diced for produce individual current measurement devices.

Although specific aspects of this disclosure have been illustrated and described for purposes of illustration, it will be understood that various modifications may be made without departing from the spirit and scope of the invention. Accordingly, the invention should not be limited except as by the appended claims.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific examples of the invention have been illustrated and described for purposes of illustration, it will be understood that various modifications may be made without departing from the spirit and scope of the invention. Accordingly, the invention should not be limited except as by the appended claims.

What is claimed is:

1. A current measurement device, comprising:
   a first measurement lead and a second measurement lead for electrically connecting the current measurement device to a test and measurement instrument or probe;
   a shunt resistor, the shunt resistor comprising a resistive core having a first end, a second end opposite the first end, and an opening extending from the first end to the second end, the shunt resistor configured to be located in a current path of a current to be measured;
   a Rogowski coil surrounding the resistive core, the Rogowski coil having electrical contacts;
   a conductive layer on the first end of the resistive core, and a conductive layer on the second end of the resistive core; and
   one or more insulative layers between each of the conductive layers and the Rogowski coil, the current measurement device configured to combine signals from the shunt resistor and the Rogowski coil.

2. The current measurement device as claimed in claim 1, wherein the current measurement device is configured to combine the signals by one of placing the Rogowski coil in series with the resistive core or adding the signals.

3. The current measurement device as claimed in claim 1, wherein the resistive core is electrically connected to one of the Rogowski coil electrical contacts and another of the Rogowski coil electrical contacts is electrically connected to the first measurement lead.

4. The current measurement device as claimed in claim 3, wherein the resistive core is electrically connected to one of the Rogowski coil electrical contacts through the conductive layer on the first end of the resistive core, and the conductive layer on the second end of the resistive core is connected to the second measurement lead.

5. The current measurement device as claimed in claim 3, wherein the resistive core is directly electrically connected to one of the Rogowski coil electrical contacts through a gap in the one or more insulative layers.

6. The current measurement device as claimed in claim 1, wherein one of the measurement leads is one of either electrically connected to the resistive core through the conductive layer on the second side of the resistive core, or directly electrically connected to the resistive core through a gap in the one or more insulative layers.

7. The current measurement device as claimed in claim 1, wherein the resistive core has a wall thickness selected to set a frequency at which the Rogowski coil becomes active.

8. The current measurement device as claimed in claim 1, wherein the Rogowski coil comprises a coil in a printed circuit board.

9. The current measurement device as claimed in claim 1:
   wherein the Rogowski coil comprises a Rogowski coil on a flexible substrate at least partially wrapped around the resistive core.

10. The current measurement device as claimed in claim 9, wherein the Rogowski coil is configured so that no loop area exists in a dimension perpendicular to the Rogowski coil.

11. The current measurement device as claimed in claim 9, wherein the Rogowski coil comprises:
   a first layer of the flexible substrate containing a first series of coil traces and first contact points;
   a second layer of the flexible substrate containing a second series of coil traces and second contact points at least partially overlaying the first series of coil traces and first contact points in a z-direction; and
   vias between the first layer and the second layer, the first series of coil traces and first contact points and the second series of coil traces and second contact points forming a Rogowski coil and one of the first contact points and the second contact points are connected to the shunt resistor.

12. The current measurement device as claimed in claim 11, further comprising a third layer between the first and second layers.

13. The current measurement device as claimed in claim 12, wherein the third layer contains a trace in a center of the Rogowski coil to act as a return path.

14. The current measurement device as claimed in claim 12, wherein the third layer is configured to provide mechanical stability to the flexible substrate, including being wider than other traces in the flexible substrate.

15. The current measurement device as claimed in claim 11, wherein the current measurement device is configured to produce a differential output signal.

16. The current measurement device as claimed in claim 15, wherein the first series of coil traces overlay the second series of coil traces so that the first contact points and the second contact points form an alternating A-B-A-B pattern in a y-direction dimension to locally cancel fields in the first dimension.

17. The current measurement device as claimed in claim 15, wherein the first series of coil traces overlay the second series of coil traces so that the first contact points and the second contact points form an A-B-B-A pattern centered in an x-direction and vary in a y-direction to locally cancel fields in the first dimension.

18. The current measurement device as claimed in claim 15, wherein the first series of coil traces overlay the second series of coil traces so that the first contact points and the second contact points form an A-B-B-A pattern centered in an x-direction and have opposing loops at extremes of the y-direction to cancel fields at a larger distance than locally canceling coils.

19. The current measurement device as claimed in claim 9, wherein the current measurement device is configured to produce a single-ended output signal.

* * * * *